US011401601B2

(12) United States Patent
Deniz et al.

(10) Patent No.: US 11,401,601 B2
(45) Date of Patent: Aug. 2, 2022

(54) PIEZOELECTRIC BULK LAYERS WITH TILTED C-AXIS ORIENTATION AND METHODS FOR MAKING THE SAME

(71) Applicant: QORVO US, INC., Greensboro, NC (US)

(72) Inventors: Derya Deniz, McKinney, TX (US); Matthew Wasilik, Plano, TX (US); Robert Kraft, Plano, TX (US); John Belsick, Bend, OR (US)

(73) Assignee: Qorvo US, Inc., Greensboro, NC (US)

( * ) Notice: Subject to any disclaimer, the term of this patent is extended or adjusted under 35 U.S.C. 154(b) by 200 days.

(21) Appl. No.: 16/569,939

(22) Filed: Sep. 13, 2019

(65) Prior Publication Data
US 2021/0079515 A1    Mar. 18, 2021

(51) Int. Cl.
| H01L 41/04 | (2006.01) |
| C23C 14/34 | (2006.01) |
| C23C 14/00 | (2006.01) |
| H01L 41/047 | (2006.01) |
| H03H 3/04 | (2006.01) |
| H03H 9/02 | (2006.01) |

(52) U.S. Cl.
CPC ...... *C23C 14/3464* (2013.01); *C23C 14/0036* (2013.01); *H01L 41/0477* (2013.01); *H03H 3/04* (2013.01); *H03H 9/02622* (2013.01)

(58) Field of Classification Search
CPC .............. H01L 41/0477; H01L 41/187; H01L 41/1871; H03H 3/04; H03H 9/02622; H03H 9/02629; C23C 14/3464; C23C 14/0036
See application file for complete search history.

(56) References Cited

U.S. PATENT DOCUMENTS

| 3,766,041 A | 10/1973 | Wasa et al. |
| 3,781,721 A | 12/1973 | Judd et al. |
| 4,320,320 A | 3/1982 | Momosaki et al. |
| 4,640,756 A | 2/1987 | Wang et al. |

(Continued)

FOREIGN PATENT DOCUMENTS

| JP | 0693435 A | 4/1994 |
| JP | 09-181369 A | 7/1997 |

(Continued)

OTHER PUBLICATIONS

U.S. Appl. No. 62/646,208, filed Mar. 21, 2018, Deniz et al.

(Continued)

*Primary Examiner* — J. San Martin
(74) *Attorney, Agent, or Firm* — Haynes and Boone, LLP

(57) ABSTRACT

A structure includes a substrate including a wafer or a portion thereof; and a piezoelectric bulk material layer comprising a first portion deposited onto the substrate and a second portion deposited onto the first portion, the second portion comprising an outer surface having a surface roughness (Ra) of 4.5 nm or less. Methods for depositing a piezoelectric bulk material layer include depositing a first portion of bulk layer material at a first incidence angle to achieve a predetermined c-axis tilt, and depositing a second portion of the bulk material layer onto the first portion at a second incidence angle that is smaller than the first incidence angle. The second portion has a second c-axis tilt that substantially aligns with the first c-axis tilt.

14 Claims, 12 Drawing Sheets

(56) References Cited

U.S. PATENT DOCUMENTS

| | | | |
|---|---|---|---|
| 4,719,383 | A | 1/1988 | Wang et al. |
| 4,917,556 | A | 4/1990 | Stark et al. |
| 5,473,216 | A | 12/1995 | Brosig et al. |
| 5,518,594 | A | 5/1996 | Marcquart et al. |
| 5,728,276 | A | 3/1998 | Katsuki et al. |
| 5,958,193 | A | 9/1999 | Brugge |
| 6,827,824 | B1 | 12/2004 | Blalock et al. |
| 6,831,525 | B1 | 12/2004 | Beaudin et al. |
| 7,033,461 | B2 | 4/2006 | Tani et al. |
| 7,047,792 | B1 | 5/2006 | Bhethanabotla et al. |
| 7,468,608 | B2 | 12/2008 | Feucht et al. |
| 7,675,388 | B2 | 3/2010 | Cardona |
| 8,409,875 | B2 | 4/2013 | Johal et al. |
| 8,689,426 | B2 | 4/2014 | Thalmayr et al. |
| 9,922,809 | B2 | 3/2018 | McCarron et al. |
| 10,063,210 | B2 | 8/2018 | McCarron et al. |
| 10,797,681 | B1* | 10/2020 | Hurwitz ............ H01L 21/76877 |
| 2002/0119657 | A1 | 8/2002 | Gandikota et al. |
| 2003/0159919 | A1 | 8/2003 | Fairbairn et al. |
| 2004/0216992 | A1 | 11/2004 | Ando et al. |
| 2005/0145477 | A1 | 7/2005 | Kaas et al. |
| 2005/0194545 | A1 | 9/2005 | Lee et al. |
| 2008/0197750 | A1 | 8/2008 | Katardjiev et al. |
| 2008/0247264 | A1 | 10/2008 | Gabl et al. |
| 2009/0134011 | A1 | 5/2009 | Rohrmann et al. |
| 2009/0178621 | A1 | 7/2009 | Sunil et al. |
| 2009/0246385 | A1 | 10/2009 | Felmetsger et al. |
| 2013/0033337 | A1 | 2/2013 | Nishihara et al. |
| 2014/0130319 | A1 | 5/2014 | Iwamoto |
| 2014/0154697 | A1 | 6/2014 | Johal et al. |
| 2014/0191619 | A1* | 7/2014 | Ito ........................... H03H 3/08 310/358 |
| 2016/0099704 | A1 | 4/2016 | Jaakkola et al. |
| 2016/0197593 | A1 | 7/2016 | Hurwitz et al. |
| 2017/0062192 | A1 | 3/2017 | Oota et al. |
| 2017/0110300 | A1 | 4/2017 | McCarron et al. |
| 2017/0111021 | A1 | 4/2017 | McCarron et al. |
| 2017/0111022 | A1 | 4/2017 | McCarron et al. |
| 2017/0111023 | A1 | 4/2017 | McCarron et al. |
| 2017/0111028 | A1 | 4/2017 | McCarron et al. |
| 2017/0168018 | A1 | 6/2017 | Morton et al. |
| 2017/0168026 | A1 | 6/2017 | Morton et al. |
| 2018/0019728 | A1 | 1/2018 | Kaajakari |
| 2019/0296710 | A1 | 9/2019 | Deniz et al. |

FOREIGN PATENT DOCUMENTS

| | | | |
|---|---|---|---|
| WO | WO 2006/101450 | A1 | 9/2006 |
| WO | WO 2012/003994 | A1 | 1/2012 |
| WO | PCT/US2016/056840 | | 10/2016 |
| WO | PCT/US2016/056843 | | 10/2016 |
| WO | PCT/US2016/066913 | | 12/2016 |
| WO | WO 2017/066448 | A1 | 4/2017 |
| WO | WO 2017/066449 | A1 | 4/2017 |
| WO | WO 2017/106489 | A3 | 6/2017 |

OTHER PUBLICATIONS

U.S. Appl. No. 62/646,212, filed Mar. 21, 2018, Deniz et al.
U.S. Appl. No. 62/646,213, filed Mar. 21, 2018, Deniz et al.
U.S. Appl. No. 15/293,063, filed Oct. 13, 2016, McCarron et al.
U.S. Appl. No. 15/293,071, filed Oct. 13, 2016, McCarron et al.
U.S. Appl. No. 15/293,082, filed Oct. 13, 2016, McCarron et al.
U.S. Appl. No. 15/293,091, filed Oct. 13, 2016, McCarron et al.
U.S. Appl. No. 15/293,108, filed Oct. 13, 2016, McCarron et al.
U.S. Appl. No. 15/380,482, filed Dec. 15, 2016, Morton et al.
U.S. Appl. No. 15/380,551, filed Dec. 15, 2016, Morton et al.
International Patent Application No. PCT/US2016/066913, filed Dec. 15, 2016; International Search Report / Written Opinion dated Jul. 11, 2017; 22 pages.
International Patent Application No. PCT/US2016/066913, filed Dec. 15, 2016; International Preliminary Report on Patentability dated Jun. 28, 2018; 13 pages.
International Patent Application No. PCT/US2016/056840, filed Oct. 13, 2016; International Search Report / Written Opinion dated Jan. 20, 2017; 19 pages.
International Patent Application No. PCT/US2016/056840, filed Oct. 13, 2016; International Preliminary Report on Patentability dated Apr. 26, 2018; 14 pages.
International Patent Application No. PCT/US2016/056843, filed Oct. 13, 2016; International Search Report / Written Opinion dated Jan. 26, 2017; 18 pages.
International Patent Application No. PCT/US2016/056843, filed Oct. 13, 2016; International Preliminary Report on Patentability dated Apr. 26, 2018; 13 pages.
Chapter 2, Ferrari et al., "Overview of Acoustic-Wave Microsensors," in *Piezoelectric Transducers and Applications*. Vives (Ed.), Springer-Verlag Berling Heidelberg; 2008. Table of Contents and pp. 39-62.
Chapter 22, Yanagitani, "Shear Mode Piezoelectric Thin Film Resonators," in *Acoustic Waves—From Microdevices to Helioseismology*. Beghi (Ed.), InTech;Nov. 14, 2011, pp. 501-520.
Author Unknown, "Understanding Planar Magnetrons for PVD Coatings," Semicore Equipment, Inc., May 14, 2013, 4 pages, www.azonano.com/article.aspx?ArticleID=3454.
Bjurström, Johan, "Advanced Thin Film Electroacoustic Devices," Digital Comprehensive Summaries of Uppsala Dissertations from the Faculty of Science and Technology, 280, ISSN 1651-6214, 2007, 86 pages.
Bjurström, et al., "Design and Fabrication of Temperature Compensated Liquid FBAR Sensors," *2006 IEEE Ultrasonics Symposium*, Oct. 2-6, 2006, pp. 894-897.
Bjurström, et al., "Synthesis of Textured Thin Piezoelectric AlN Films With a Nonzero C-Axis Mean Tilt for the Fabrication of Shear Mode Resonators," IEEE Transactions on Ultrasonics, Ferroelectrics, and Frequency Control, vol. 53, No. 11, Nov. 2006, pp. 2095-2100.
Chang et al., "The influence of Mg doped ZnO thin films on the properties of Love wave sensors," May 28, 2008, *Sensors and Actuators B*, 132(1):290-295.
Chen et al., "Characteristics of Dual Mode AlN Thin Film Bulk Acoustic Wave Resonators," IEEE International Frequency Control Symposium [online], May 19-21, 2008, published in: May 2008, *IEEE*, 609-14.
Chen et al., "The Liquid Sensor Using Thin Film Bulk Acoustic Resonator with C-Axis Tilted AlN Films," 2013, *Journal of Nanomaterials*, 2013:8.
Chen et al., "Temperature stability of ZnO-based Love wave biosensor with SiO2 buffer layer," Dec. 1, 2009, *Sensors and Actuators A*, 156(2):317-22.
Connolly, "Diffraction Basics, Part 2," Spring 2012, *EPS400-002, Introduction to X-Ray Powder Diffraction*, 12 pages.
Corso, et al., "Development of a Simple Inexpensive Bulk Acoustic Wave (BAW) Nanosensor for Cancer Biomarkers: Detection on Secreted Sonic Hedgehog from Prostate Cancer Cells", Abstract #8866, Winship Cancer Institute, Emory University, Georgia Institute of Technology, Oct. 2012, 1 page.
Demiguel-Ramos, M. et al., "Induced Surface Roughness to Promote the Growth of Tilted-AlN Films for Shear Mode Resonators," 2013 Joint UFFC, EFTF and PFM Symposium Proceedings, 2013, IEEE, pp. 274-277.
Depla et al. "Sputter Deposition Process," 2010. *Handbook of Deposition Technologies for Films and Coatings: Science, Applications and Technology*, 253-96.
Fardeheb-Mammfri, A. et al., "Growth and characterization of c-axis included AlN films for shear wave devices," Semiconductor Science and Technology, vol. 23, Aug. 12, 2008, 7 pages.
Fardeheb-Mammeri, A. et al., "Growth of inclined c-axis AlN films in planar system for BAW devices," Journal of Electron Devices, vol. 5, 2007, pp. 132-137.
García-Gancedo, L. et al., "AlN-based BAW resonators with CNT electrodes for gravimetric biosensing," Sensors and Actuators B: Chemical, vol. 160, No. 1, Dec. 15, 2011, pp. 1386-1393.

(56) References Cited

OTHER PUBLICATIONS

García-Gancedo, L. et al., "Dual-Mode Thin Film Bulk Acoustic Wave Resonators for Parallel Sensing of Temperature and Mass Loading," Biosensors and Bioelectronics, vol. 38, No. 1, Oct.-Dec. 2012, pp. 369-374.

Iriarte, Gonzalo F. et al., "Synthesis of C-Axis-Oriented AlN Thin Films on High-Conducting Layers: Al, Mo, Ti, TiN, and Ni," IEEE Transactions on Ultrasonics, Ferroelectrics, and Frequency Control, vol. 52, No. 7, Jul. 2005, pp. 1170-1174.

Jamneala et al. "Modified Mason Model for Bulk Acoustic Wave Resonators," Sep. 2008, *IEEE Transactions on Ultrasonics, Ferroelectrics, and Frequency Control*, 55(9):2025-29.

Kobayashi, "X-ray thin film measurement techniques: IV. In-plan XRD measurements," 2010, *The Rigaku Journal*, 26(1):3-11.

Koskenvuori et al., "Temperature Measurement and Compensation Based on Two Vibrating Modes of a Bulk Acoustic Mode Microresonator," *MEMS 2008*, Tucson, Arizona, Jan. 13-17, 2008, pp. 78-81.

Lakin, "Modeling of Thin Film Resonators and Filters," 1992, *IEEE MTT-S Microwave Symposium Digest*, pp. 149-152.

Lee et al., "Microfluidic Mixing: A Review," May 18, 2011, *International Journal of Molecular Sciences*, 12:3263-87.

Link, Mathias, "Study and realization of shear wave mode solidly mounted film bulk acoustic resonators (FBAR) made of c-axis inclined zinc oxide (ZnO) thin films: application as gravimetric sensors in liquid environments," Université Henri Poincaré—Nancy I, Thesis, Sep. 14, 2006, 225 pages.

Milyutin, Evgeny, "Theoretical and Experimental Study of Piezoelectric Modulated AlN Thin Films for Shear Mode BAW Resonators," EPFL, Thesis No. 5113, Nov. 4, 2011, 109 pages.

Montagut, Yeison et al. "QCM Technology in Biosensors," Biosensors—Emerging Materials and Applications, Chapter 9, 2011, INTECH Open Access Publisher, pp. 153-178.

Moreira et al., "Synthesis of c-tilted AlN films with a good tilt and thickness uniformity," 2011 IEEE International Ultrasonics Symposium Proceedings, 2011, pp. 1238-1241.

Moreira, "Synthesis of Thin Piezoelectric AlN Films in View of Sensors and Telecom Applications," Digital Comprehensive Summaries of Uppsala Dissertations from the Faculty of Science and Technology, 1160, ISSN 1651-6214, 2014, 84 pages.

Munir, "A Fast, Scalable Acoustic Resonator-Based Biosensor Array System for Simultaneous Detection of Multiple Biomarkers", Thesis, Georgia Institute of Technology, Dec. 2012, 160 pages.

Nirschl et al., "CMOS-Integrated Film Bulk Acoustic Resonators for Label-Free Biosensing," Sensors, vol. 10, No. 5, Apr. 27, 2010, pp. 4180-4193.

Petit, D., et al., "Temperature Compensated BAW Resonator and Its Integrated Thermistor for a 2.5 GHz Electrically Thermally Compensated Oscillator," IEEE Radio Frequency Integrated Circuits Symposium, Jun. 7-9, 2009, pp. 339-342.

Pierce, D.E., et al., "A Temperature Insensitive Quartz Microbalance," IEEE Transactions on Ultrasonics, Ferroelectrics, and Frequency Control, vol. 45, No. 5, Sep. 1998, pp. 1238-1245.

Qin et al., "Analytical Study of Dual-Mode Thin Film Bulk Acoustic Resonators (FBARs) Based on ZnO and AlN Films with Tilted c-Axis Orientation," Aug. 2010, *IEEE Trans. UFFC*, 57(8):1840-53.

Qorvo US, Inc. "Summary of Sales Activity of Predecessor to Applicant Concerning Tilted C-Axis Aluminum Nitride Products," Unpublished, Jan. 10, 2017, 1 page.

Rabus et al., "A high sensitivity open loop electronics for gravimetric acoustic wave-based sensors," Jun. 2013, *IEEE Transactions on Ultrasonics, Ferroelectrics, and Frequency Control*, 60(6):1219-1226.

Sebastian, Chapter 2, "Dielectric Materials for Wireless Communication" in *Measurement of Microwave Dielectric Properties and Factors Affecting Them*, 2008. pp. 11-47.

Smith, J. H., et al., "Self-Consistent Temperature Compensation for Resonant Sensor with Application to Quartz Bulk Acoustic Wave Chemical Sensors," 8th International Conference on Solid-State Sensors and Actuators, 1995, and Eurosensors IX, Transducers '95, vol. 2, Jun. 25-29, 1995, pp. 724-727.

Stan, et al., "Tilt c Axis Crystallite Growth of Aluminium Nitride Films by Reactive RF-Magnetron Sputtering," Mar. 2012, *Digest Journal of Nanomaterials and Biostructures*, 7(1):41-50.

Suzuki, Masashi et al., "C-axis parallel oriented AlN film resonator fabricated by ion-beam assisted RF magnetron sputtering," 2011 IEEE International Ultrasonics Symposium Proceedings, 2011, pp. 1230-1233.

Thornton, "Influence of apparatus geometry and deposition conditions on the structure and topography of thick sputtered coatings," 1974, *J. Vac. Sci. Technology*, A 11:666.

Waite, Matthew M. et al., "Sputtering Sources," 50 Years of Vacuum Coating Technology and the growth of the Society of Vacuum Coaters, Chapter 15, 2007, Society of Vacuum Coaters, Spring Bulletin, 2010, pp. 42-50.

Wang, J.S. et al., "Sputtered C-Axis Inclined Piezoelectric Films and Shear Wave Resonators," IEEE 37th Annual Symposium on Frequency Control, 1983, IEEE, pp. 144-150.

Yanagitani, T. et al., "Pure-shear mode BAW resonators consisting of (11-20) textured ZnO films," Acoustics 08 Paris, 2008, pp. 4987-4992.

Ye, et al. "Photoreactivity of Alky siloxane Self-Assembled Monolayers on Silicon Oxide Surfaces," Langmuir, vol. 17, No. 15, Jun. 21, 2001, pp. 4497-4500.

Yu, et al., "Ultra Temperature-Stable Bulk-Acoustic-Wave Resonators with $SiO_2$ Compensation Layer," IEEE Transactions on Ultrasonics, Ferroelectrics, and Frequency Control, vol. 54, No. 10, Oct. 2007, pp. 2102-2109.

Zhang, X et al. "Excimer laser ablation of thin gold films on quartz crustal microbalance at various argon background pressures," Applied Physics A, vol. 64, No. 6, Jun. 1997 pp. 545-552.

Zhou, Yan et al. "Interfacial Structures and Properties of Organize Materials for Biosensors: An Overview," Sensors, vol. 12 Nov. 6, 2012, pp. 15039-15062.

International Search Report and Written Opinion for PCT/US20/50333 dated Dec. 21, 2020, 13 pages.

International Search Report and Written Opinion for PCT/US20/56792 dated Jan. 14, 2021, 9 pages.

\* cited by examiner

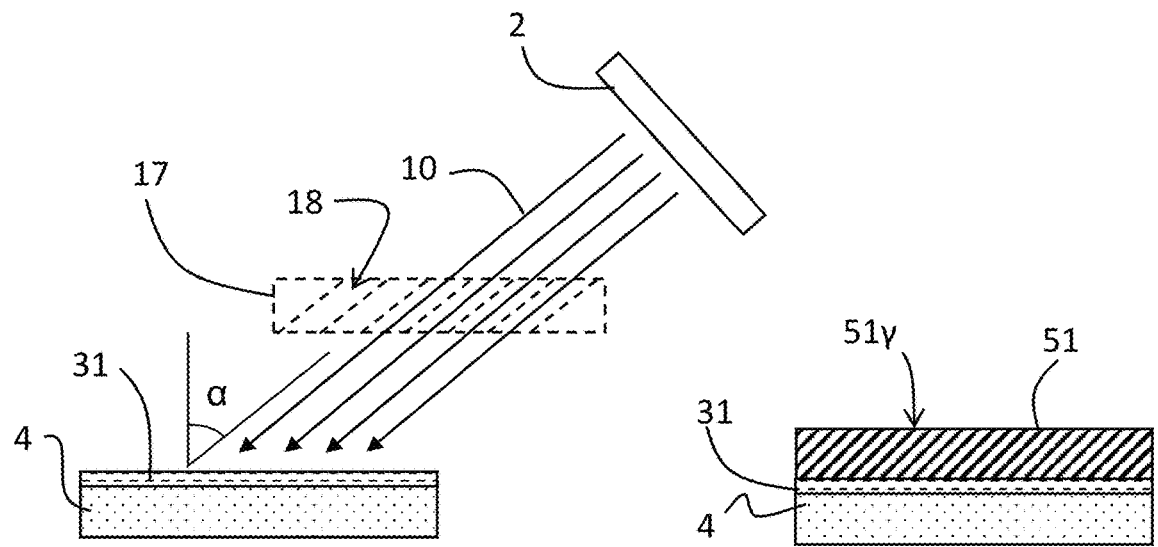
FIG. 3A
FIG. 3B
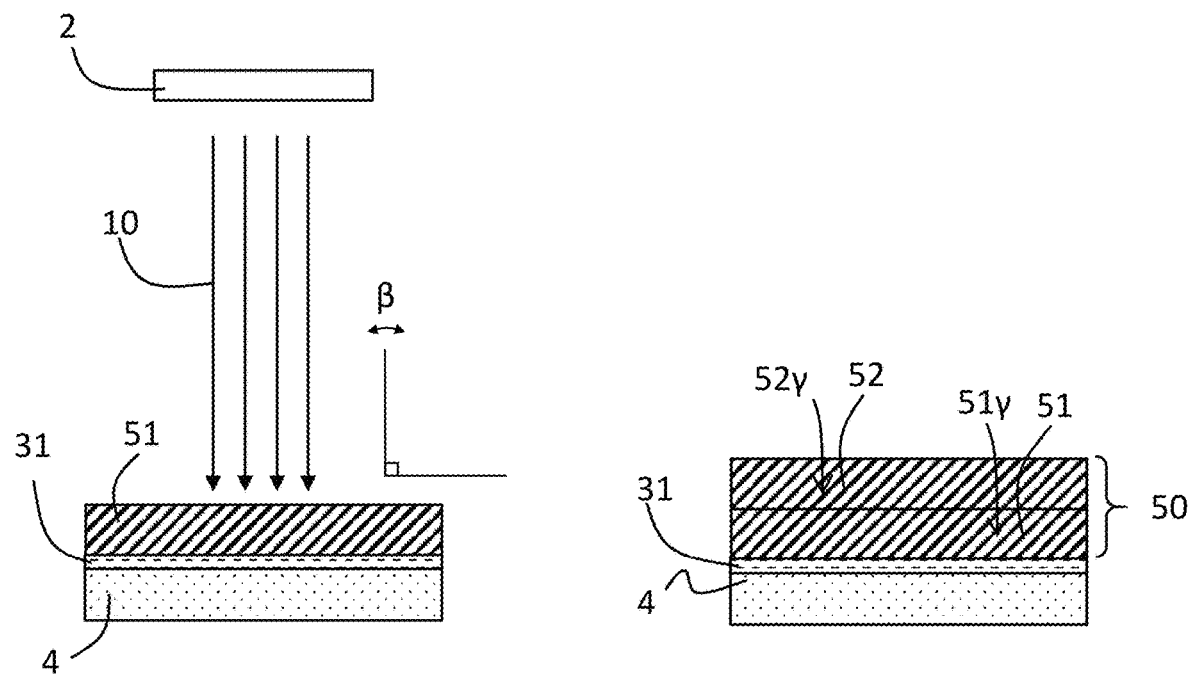
FIG. 3C
FIG. 3D

PIEZOELECTRIC BULK LAYERS WITH TILTED C-AXIS ORIENTATION AND METHODS FOR MAKING THE SAME

FIELD

The present disclosure relates to structures including inclined c-axis hexagonal crystal structure materials, as well as systems and methods for producing such materials. In particular, the present disclosure relates to structures including inclined c-axis hexagonal crystal structure piezoelectric materials such as aluminum nitride (AlN) and zinc oxide (ZnO). Inclined c-axis hexagonal crystal structure piezoelectric materials may be used, for example, in various resonators as well as in thin film electroacoustic and/or sensor devices, particularly for sensors operating in liquid/viscous media (e.g., chemical and biochemical sensors), and the like.

BACKGROUND

Hexagonal crystal structure piezoelectric materials such as AlN and ZnO are of commercial interest due to their piezoelectric and electroacoustic properties. A primary use of electroacoustic technology has been in the telecommunication field (e.g., for oscillators, filters, delay lines, etc.). More recently, there has been a growing interest in using electroacoustic devices in high frequency sensing applications due to the potential for high sensitivity, resolution, and reliability. However, it is not trivial to apply electroacoustic technology in certain sensor applications—particularly sensors operating in liquid or viscous media (e.g., chemical and biochemical sensors)—since longitudinal and surface waves exhibit considerable acoustic leakage into such media, thereby resulting in reduced resolution.

In the case of a piezoelectric crystal resonator, an acoustic wave may embody either a bulk acoustic wave (BAW) propagating through the interior (or 'bulk') of a piezoelectric material, or a surface acoustic wave (SAW) propagating on the surface of the piezoelectric material. SAW devices involve transduction of acoustic waves (commonly including two-dimensional Rayleigh waves) utilizing interdigital transducers along the surface of a piezoelectric material, with the waves being confined to a penetration depth of about one wavelength. BAW devices typically involve transduction of an acoustic wave using electrodes arranged on opposing top and bottom surfaces of a piezoelectric material. In a BAW device, different vibration modes can propagate in the bulk material, including a longitudinal mode and two differently polarized shear modes, wherein the longitudinal and shear bulk modes propagate at different velocities. The longitudinal mode is characterized by compression and elongation in the direction of the propagation, whereas the shear modes consist of motion perpendicular to the direction of propagation with no local change of volume. The propagation characteristics of these bulk modes depend on the material properties and propagation direction respective to the crystal axis orientations. Because shear waves exhibit a very low penetration depth into a liquid, a device with pure or predominant shear modes can operate in liquids without significant radiation losses (in contrast with longitudinal waves, which can be radiated in liquid and exhibit significant propagation losses). Restated, shear mode vibrations are beneficial for operation of acoustic wave devices with fluids because shear waves do not impart significant energy into fluids.

Certain piezoelectric thin films are capable of exciting both longitudinal and shear mode resonance. To excite a wave including a shear mode using a standard sandwiched electrode configuration device, a polarization axis in a piezoelectric thin film must generally be non-perpendicular to (e.g., tilted relative to) the film plane. Hexagonal crystal structure piezoelectric materials such as (but not limited to) aluminum nitride (AlN) and zinc oxide (ZnO) tend to develop their polarization axis (i.e., c-axis) perpendicular to the film plane, since the (0001) plane typically has the lowest surface density and is thermodynamically preferred. Certain high-temperature (e.g., vapor phase epitaxy) processes may be used to grow tilted c-axis films, but providing full compatibility with microelectronic structures such as metal electrodes or traces requires a low temperature deposition process (e.g., typically below about 300° C.).

Low temperature deposition methods such as reactive radio frequency magnetron sputtering have been used for preparing tilted AlN films. However, these processes tend to result in deposition angles that vary significantly with position over the area of a substrate, which leads to a c-axis direction of the deposited piezoelectric material that varies with radial position of the target to the source.

One effect of the lack of uniformity of c-axis tilt angle of the AlN film structure over the substrate is that if the AlN film-covered substrate were to be diced into individual chips, the individual chips would exhibit significant variation in c-axis tilt angle and concomitant variation in acoustic wave propagation characteristics. Such variation in c-axis tilt angle would render it difficult to efficiently produce large numbers of resonator chips with consistent and repeatable performance.

Improved methods and systems for producing bulk films with c-axis tilt have been described, where the c-axis tilt of the bulk layer is primarily controlled by controlling the deposition angle. For example, a device and method for depositing seed and bulk layers with a tilted c-axis are described in U.S. patent application Ser. No. 15/293,063 entitled "Deposition System for Growth of Inclined C-Axis Piezoelectric Material Structures;" U.S. patent application Ser. No. 15/293,071 entitled "Methods for Fabricating Acoustic Structure with Inclined C-Axis Piezoelectric Bulk and Crystalline Seed Layers;" U.S. patent application Ser. No. 15/293,082 entitled "Acoustic Resonator Structure with Inclined C-Axis Piezoelectric Bulk and Crystalline Seed Layers;" U.S. patent application Ser. No. 15/293,091 entitled "Multi-Stage Deposition System for Growth of Inclined C-Axis Piezoelectric Material Structures;" and U.S. patent application Ser. No. 15/293,108 entitled "Methods for Producing Piezoelectric Bulk and Crystalline Seed Layers of Different C-Axis Orientation Distributions". These published patent applications also describe, among other things, the use of collimators and control mechanisms to provide for more uniform c-axis tilt of bulk films across the surface of the substrate. The use of collimators may result in a substantial amount of deposition of the bulk layer on the collimator rather than on the substrate, which may lead to waste and inefficiencies in the process.

These published patent applications also describe attempts to deposit a bulk layer directly onto a substrate without first depositing a seed layer (see, for example, U.S. patent application Ser. No. 15/293,071). However, such bulk layers did not exhibit a desired c-axis tilt angle distribution and failed to exhibit a desired minimum shear mode to longitudinal coupling ratio of at least 1.25 (which would result in structures that would not be suitable for use as bulk acoustic sensing resonators in liquid/viscous media), despite being deposited under the same conditions as used for bulk layers deposited onto seed layers (which exhibited desired properties).

Bulk layers with improved properties are desired.

SUMMARY

The present disclosure provides, among other things, bulk acoustic wave resonator structures and methods for fabricating such resonator structures. The bulk acoustic wave resonator structures include a bulk layer with inclined c-axis hexagonal crystal structure material (e.g., piezoelectric material). The hexagonal crystal structure bulk layer is supported by a substrate. The bulk layer may be formed in a two-step process. In the first step a portion of the bulk layer is deposited at an off-normal angle of incidence to achieve a desired c-axis tilt. Once the c-axis tilt is established, the remainder of the bulk layer is deposited at normal incidence. Despite being deposited at normal incidence, the remaining bulk layer tends to adopt the c-axis tilt of the previously deposited crystal layer. Such processes may be performed without the use of a traditional seed layer, which tend to promote (103) texture with no in-plane alignment along the (002) direction, or such processes may be performed using a traditional seed layer.

In some embodiments, a structure includes a substrate comprising a wafer or a portion thereof; and a piezoelectric bulk material layer having a first portion deposited onto the substrate and a second portion deposited onto the first portion, the second portion having an outer surface having a surface roughness (Ra) of 4.5 nm or less. The piezoelectric bulk material layer may have a c-axis tilt of about 35 degrees to about 52 degrees. The crystalline bulk layer may exhibit a ratio of shear coupling to longitudinal coupling of 1.25 or greater during excitation.

The structure may include a bump disposed at least partially on the bulk material layer. According to an embodiment, the bump contact may exhibit a shear strength that can resist forces of 80 g or greater, 100 g or greater, 110 g or greater, 120 g or greater, 130 g or greater, or 140 g or greater.

The bulk material layer may have a thickness of about 1,000 Angstroms to about 30,000 Angstroms. The thickness may vary by less than 2% over an area of the bulk material layer.

In some embodiments, a crystalline bulk layer having a c-axis tilt with a preselected angle is prepared by a method that includes deposition of a first portion in a first growth step under deposition conditions comprising a pressure of 5 mTorr or less. The first growth step is performed at off-normal incidence. Preferably, the deposited bulk layer has a c-axis tilt of about 35 degrees or greater. For example, the bulk material layer may be deposited at a deposition angle of about 35 degrees to about 85 degrees. Preferably, the deposition in the first growth step is under conditions that retard surface mobility of the material being deposited such that crystals in the bulk material layer are substantially parallel to one another and are substantially oriented in a direction of the preselected angle. The method further comprises deposition of a second portion in a second growth step comprising depositing a bulk material layer at a smaller incidence angle, e.g., about a normal incidence. Despite being deposited at about normal incidence, the second portion of bulk material layer deposited in the second growth step orients to the c-axis tilt of the first portion, e.g., about 35 degrees or greater. The bulk material may exhibit a ratio of shear coupling to longitudinal coupling of 1.25 or greater during excitation. The bulk layer (e.g., the second portion) may have an outer surface having a surface roughness (Ra) of 4.5 nm or less.

In some embodiments, a crystalline bulk layer having a c-axis tilt with a preselected angle is prepared by a method that includes depositing a first portion of a bulk material layer onto a substrate at a first incidence angle, the first portion having a first c-axis tilt; and depositing a second portion of the bulk material layer onto the first portion at a second incidence angle that is smaller than the first incidence angle, the second portion having a second c-axis tilt that substantially aligns with the first c-axis tilt. The first portion may be deposited directly onto the surface of the substrate. The bulk layer (e.g., the second portion) may have an outer surface having a surface roughness (Ra) of 4.5 nm or less.

In some embodiments, a crystalline bulk layer having a c-axis tilt with a preselected angle is prepared by a method that includes depositing a seed layer on a substrate under deposition conditions comprising a pressure of 10 mTorr or greater; and depositing a crystalline bulk layer having a c-axis tilt with a preselected angle on the seed layer. Depositing the bulk layer comprises a two-step process. A first portion is deposited in a first growth step performed at a first incidence angle that is an off-normal incidence angle. Preferably, the deposited first portion of the bulk layer has a c-axis tilt of the preselected angle. The method further comprises a second growth step comprising depositing a second portion of bulk material layer at a second incidence angle that is smaller than the first incidence angle. Despite being deposited at about normal incidence, the second portion of bulk material layer deposited in the second growth step orients to the c-axis tilt of the first portion. The bulk material may exhibit a ratio of shear coupling to longitudinal coupling of 1.25 or greater during excitation. The bulk layer (e.g., the second portion) may have an outer surface having a surface roughness (Ra) of 4.5 nm or less.

In various embodiments described herein, the bulk layer is prepared such that the c-axis orientation of the crystals in the bulk layer is selectable within a range of about 0 degrees to about 90 degrees, such as from about 30 degrees to about 52 degrees, or from about 35 degrees to about 46 degrees. The c-axis orientation distribution is preferably substantially uniform over the area of a large substrate (e.g., having a diameter in a range of at least about 50 mm or greater, about 100 mm or greater, or about 150 mm or greater), thereby enabling multiple chips to be derived from a single substrate and having the same or similar acoustic wave propagation characteristics.

In various embodiments described herein, the bulk material layer has a thickness of about 1,000 Angstroms to about 30,000 Angstroms. The bulk material layer may be deposited at a deposition angle of about 35 degrees to about 85 degrees. The bulk material may exhibit a ratio of shear coupling to longitudinal coupling of 1.25 or greater during excitation.

In various embodiments described herein, a structure includes a substrate comprising a wafer and a piezoelectric bulk material layer deposited onto a surface of the wafer, where the bulk material layer has a c-axis tilt of about 32 degrees or greater. The structure may exhibit a ratio of shear coupling to longitudinal coupling of 1.25 or greater during excitation. The bulk layer (e.g., the second portion) may have an outer surface having a surface roughness (Ra) of 4.5 nm or less.

In various embodiments described herein, a bulk acoustic wave resonator includes a structure including a substrate comprising a wafer and a piezoelectric bulk material layer deposited onto a surface of the wafer, where the bulk material layer has a c-axis tilt of about 32 degrees or greater, where at least a portion of piezoelectric bulk material layer is between the first electrode and the second electrode. The bulk layer (e.g., the second portion) may have an outer surface having a surface roughness (Ra) of 4.5 nm or less.

BRIEF DESCRIPTION OF DRAWINGS

FIGS. 3A-3D are schematic views illustrating a process for depositing a bulk layer on a substrate having a seed layer to achieve a desired c-axis tilt in accordance with an embodiment described herein.

DETAILED DESCRIPTION

The present disclosure relates to crystalline bulk layers and methods of depositing crystalline bulk layers that allow for selecting the c-axis tilt of the crystalline material. The present disclosure relates to crystalline bulk layers with improved properties, such as improved mechanical quality factor, reduced acoustic losses, reduced ohmic (electrical) losses, reduced surface roughness, and/or improved mechanical strength when manufactured into devices. The bulk layer may be formed in a two-step process. In the first step, a portion of the bulk layer is deposited at an off-normal angle of incidence to achieve a desired c-axis tilt. Once the c-axis tilt is established, the remainder of the bulk layer is deposited at normal incidence. Despite being deposited at normal or approximately normal incidence, the remaining bulk layer tends to adopt the c-axis tilt of the previously deposited crystal layer. The bulk layer may be deposited directly on a substrate or may be deposited on a substrate with a seed layer.

The present disclosure relates to crystalline bulk layers that exhibit low surface roughness and low variation in thickness. The crystalline bulk layers may be used to prepare resonators that exhibit high shear strength, high ratio of shear coupling to longitudinal coupling, and low variation in resonance frequency and dry gain.

Improvements to crystalline bulk layers and methods for making the same are desired to provide, for example, one or more of: additional control over the angle of the c-axis of crystals in bulk layers; improved characteristics such as reduced roughness of film surface, increased mechanical quality factor, increased coupling coefficient, increased uniformity of bulk layer thickness, or increased shear to longitudinal coupling ratio; and improved manufacturing efficiency of bulk layers, and improved performance of devices using the films.

Depositing a crystalline bulk layer at about normal incidence and achieving a desired c-axis tilt reduces waste and processing efficiency. For example, deposition at normal incidence may be done without a collimator, reducing material losses of the bulk layer material due to deposition on the collimator. Accordingly, more bulk layer material may be transferred directly onto the substrate. Further, the frequency of cleaning off built-up deposits on the collimator, or collimator replacement, may be reduced. In addition, deposition at normal incidence may be faster, and may be performed using standard equipment and process conditions. These and other advantages will be readily understood by those of skill in the art.

Figure 1:
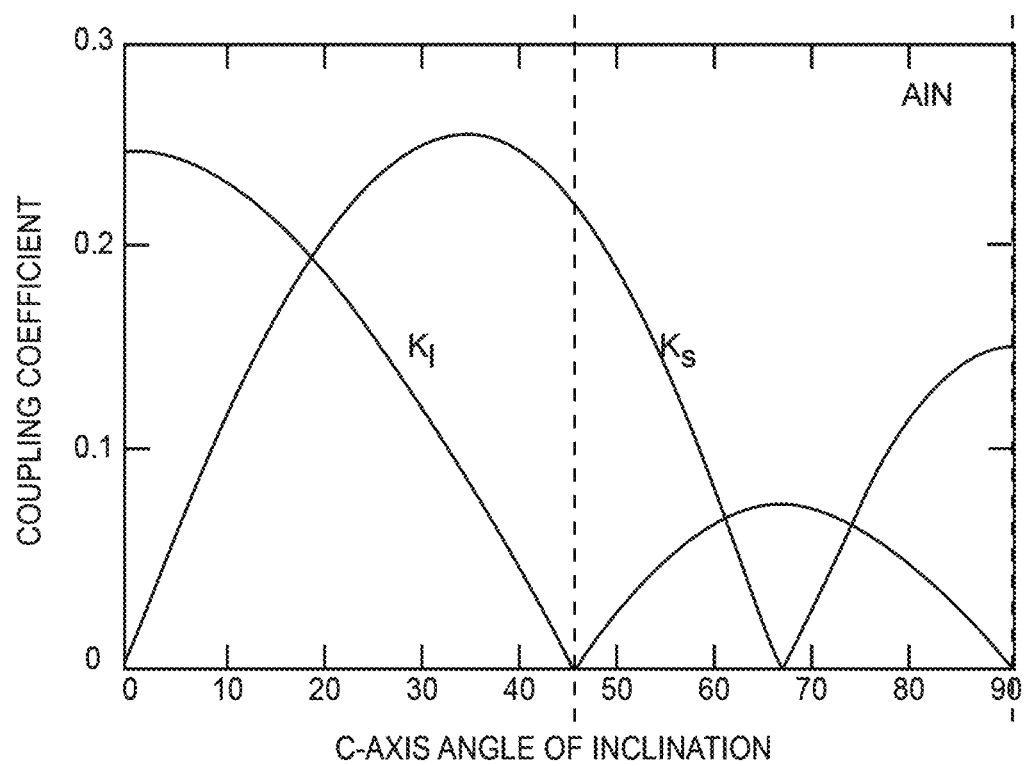
FIG. 1 is a plot of shear coupling coefficient (Ks) and longitudinal coupling coefficient (Kl) as a function of c-axis angle of inclination for AN.
Figures 2A, 2B:
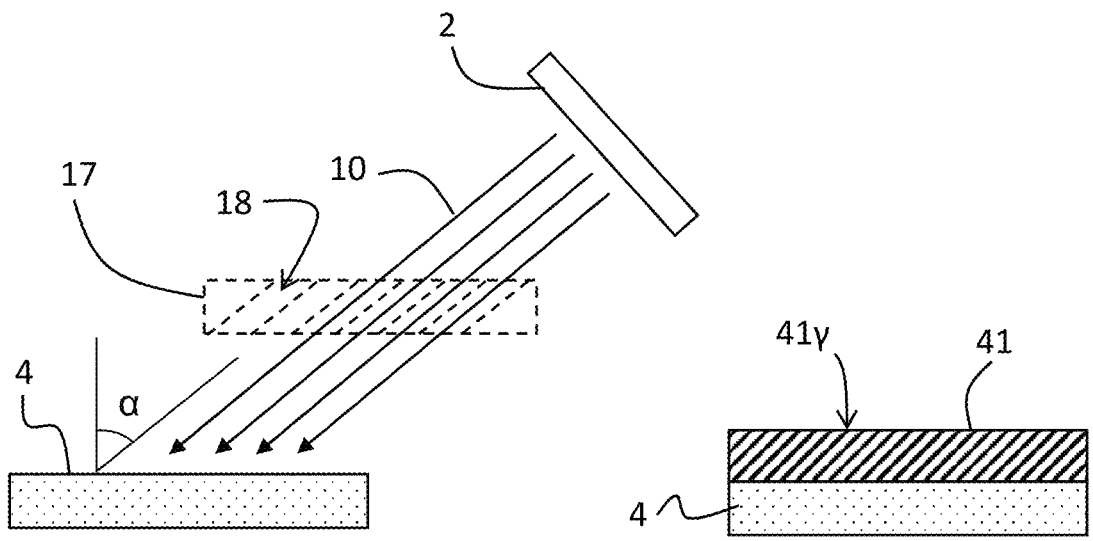
FIGS. 2A-2D are schematic views illustrating a process for depositing a bulk layer on a substrate without a seed layer to achieve a desired c-axis tilt in accordance with an embodiment described herein.
Figures 2C, 2D:
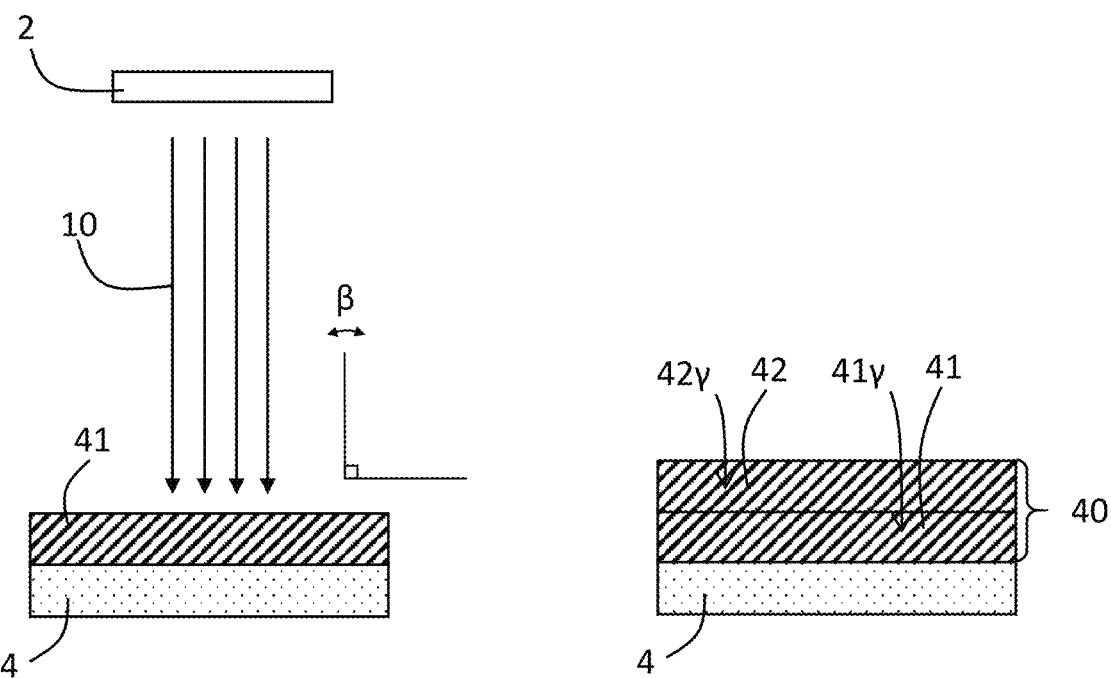

The methods of the present disclosure provide for preparing a structure having a crystalline bulk layer c-axis tilt of a preselected angle. The desired c-axis tilt depends on the intended purpose, use, and effect of the bulk layer. Changing the c-axis angle of inclination for hexagonal crystal structure piezoelectric materials causes variation in shear and longitudinal coupling coefficients, as shown in FIG. 1. FIG. 1 embodies plots of shear coupling coefficient (Ks) and longitudinal coupling coefficient (Ki) each as a function of c-axis angle of inclination for AlN. It can be seen that a maximum electromechanical coupling coefficient of shear mode resonance in AlN is obtained at a c-axis angle of inclination of about 35 degrees, that a pure shear response (with zero longitudinal coupling) is obtained at a c-axis angle of inclination of about 46 degrees, and that the shear coupling coefficient exceeds the longitudinal coupling coefficient for c-axis angle of inclination values in a range from about 19 degrees to about 63 degrees. The longitudinal coupling coefficient is also zero at a c-axis angle of inclination of 90 degrees, but it is impractical to grow AlN at very steep c-axis inclination angles. Similar behavior is expected for other piezoelectric materials, although the specific angle positions may vary. For electroacoustic resonators intended to operate in liquids or other viscous media, it would be desirable to provide piezoelectric films with a c-axis tilt angle sufficient to provide a shear coupling coefficient that exceeds a longitudinal coupling coefficient—in certain embodiments, at a c-axis tilt angle in which the longitudinal coupling coefficient approaches zero, or at a c-axis-tilt angle at or near a value where shear coupling is maximized. Thus, for an electroacoustic resonator including an AlN piezoelectric layer, it would be desirable to provide a c-axis tilt angle in a range of from about 19 degrees to about 63 degrees, and particularly desirable to provide a c-axis tilt angle between 35 and 46 degrees. Other c-axis tilt angles may be desirable for other purposes or when materials other than AlN are used for deposition.

The shear coupling coefficient for a bulk acoustic wave resonator comprising a bulk layer of AlN exceeds the longitudinal coupling coefficient for c-axis angle of inclination values in a range of from about 19 degrees to about 63 degrees. A greater difference between the shear mode and longitudinal coupling is achieved approximately between 30 degrees and 52 degrees, and a pure shear mode resonance response (with zero longitudinal coupling) can be obtained at a c-axis angle of inclination of about 46 degrees. Therefore, it would be desirable to be able to prepare an AlN bulk layer with a c-axis tilt of between about 30 degrees and about 52 degrees, between about 32 degrees and about 50 degrees, between about 35 degrees and about 50 degrees, between about 35 degrees and about 48 degrees, or about 46 degrees. In some embodiments, shear mode excitation may be increased by depositing a bulk layer with a c-axis tilt of about 30 degrees to about 52 degrees, about 32 degrees to about 50 degrees, or about 35 degrees to about 48 degrees. Other angles of the c-axis tilt may also be useful in other embodiments. For example, c-axis tilts of about 30 degrees to about 45 degrees, about 32 degrees, or about 90 degrees could be of interest in some embodiments.

The term "c-axis" is used here to refer to the (002) direction of a deposited crystal with a hexagonal wurtzite structure. The c-axis is typically the longitudinal axis of the crystal.

The terms "c-axis tilt," "c-axis orientation," and "c-axis incline" are used here interchangeably to refer to the angle of the c-axis relative to a normal of the surface plane of the deposition substrate.

When referring to c-axis tilt or c-axis orientation, it should be understood that even if a single angular value is given, the crystals in a deposited crystal layer (e.g., a seed layer or a bulk layer) may exhibit a distribution of angles. The distribution of angles typically approximately follows a normal (e.g., Gaussian) distribution that can be graphically demonstrated, for example, as a two-dimensional plot resembling a bell-curve, or by a pole figure.

The term "incidence angle" is used here to refer to the angle at which atoms are deposited onto a substrate, measured as the angle between the deposition pathway and a normal of the surface plane of the substrate.

The term "substrate" is used here to refer to a material onto which a seed layer or a bulk layer may be deposited. The substrate may be, for example, a wafer, or may be a part of a resonator device complex or wafer, which may also include other components, such as an electrode structure arranged over at least a portion of the substrate. A seed layer is not considered to be "a substrate" in the embodiments of this disclosure.

When referring to deposition of crystals "on a substrate," there may be intervening layers (e.g., a seed layer) between the substrate and the crystals. However, the expressions "directly on a substrate" or "on the surface of the substrate" are intended to exclude any intervening layers.

The term "seed layer" is used here to refer to a crystalline layer that is dominated by (103) texture with little or no in-plane alignment along the (002) direction, and onto which a bulk material layer may be deposited.

The term "bulk layer" is used here to refer to a crystalline layer that exhibits primarily (002) texture. The bulk layer may be formed in one or more steps. Reference to the bulk layer in this disclosure refers to the entire bulk layer, whether the bulk layer is formed in a single step, two steps, or more than two steps. The term "first portion" is used in this disclosure to refer to a first deposited part (e.g., layer) of the bulk layer that exhibits primarily (002) texture.

The term "substantially" as used here has the same meaning as "nearly completely," and can be understood to modify the term that follows by at least about 90%, at least about 95%, or at least about 98%.

The terms "parallel" and "substantially parallel" with regard to the crystals refer to the directionality of the crystals. Crystals that are substantially parallel not only have the same or similar c-axis tilt but also point in the same or similar direction.

The term "about" is used here in conjunction with numeric values to include normal variations in measurements as expected by persons skilled in the art, and is understood have the same meaning as "approximately" and to cover a typical margin of error, such as ±5% of the stated value.

All scientific and technical terms used herein have meanings commonly used in the art unless otherwise specified. The definitions provided herein are to facilitate understanding of certain terms used frequently herein and are not meant to limit the scope of the present disclosure.

As used here, the singular forms "a", "an", and "the" encompass embodiments having plural referents, unless the content clearly dictates otherwise.

As used here, the term "or" is generally employed in its sense including "and/or" unless the content clearly dictates otherwise. The term "and/or" means one or all of the listed elements or a combination of any two or more of the listed elements.

As used here, "have", "having", "include", "including", "comprise", "comprising" or the like are used in their open-ended sense, and generally mean "including, but not limited to." It will be understood that "consisting essentially of," "consisting of," and the like are subsumed in "comprising" and the like. As used herein, "consisting essentially of," as it relates to a composition, product, method or the like, means that the components of the composition, product, method or the like are limited to the enumerated components and any other components that do not materially affect the basic and novel characteristic(s) of the composition, product, method or the like.

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

The recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

Any direction referred to here, such as "top," "bottom," "left," "right," "upper," "lower," and other directions and orientations are described herein for clarity in reference to the figures and are not to be limiting of an actual device or system or use of the device or system. Devices or systems as described herein may be used in a number of directions and orientations.

The present disclosure relates in various aspects to crystalline bulk layers, bulk acoustic wave resonator structures, and to methods for fabricating such bilk layers and resonator structures. As compared to conventional resonator structures, fabrication methods, and deposition systems, various embodiments of the present disclosure include or enable inclined c-axis piezoelectric films with a preselected c-axis tilt angle with an increased range of selectable angles. The inclined c-axis piezoelectric films may also exhibit improved mechanical quality factor, reduced acoustic losses, reduced ohmic (electrical) losses, reduced surface roughness, and/or improved mechanical strength when manufactured into devices. The inclined c-axis piezoelectric films may be fabricated over large areas (e.g., large area substrates) with increased uniformity of c-axis tilt angle. The methods for making the inclined c-axis piezoelectric films may be more efficient or reduce waste relative to prior art methods for preparing inclined c-axis piezoelectric films.

The methods described herein include a bulk layer deposition process with two or more steps. The process may further include depositing a seed layer on a substrate or may include deposition of the bulk layer directly on the substrate (without an intervening seed layer).

Referring now to FIGS. 2A-2D and 3A-3D, schematic diagrams for two-step bulk layer deposition processes are shown. FIGS. 2A-2D illustrate a process in which the bulk layer 40 is directly deposited on a substrate 4 without a seed layer. The first growth step (shown in FIG. 2A) includes ejection of metal atoms from a target 2 of a linear sputtering apparatus to react with a gas species forming a deposition flux 10 to be received by the substrate 4. The deposition system may include a multi-aperture collimator 17 arranged between the target and the substrate. The deposition flux 10 may be directed through the apertures 18 of the collimator 17 to help control the incidence angle during deposition. The deposition flux 10 arrives at the substrate 4 at a first incidence angle α, forming a first portion 41 of the bulk layer 40 (shown in FIG. 2B). The crystals of the first portion 41 of the bulk layer 40 have a c-axis tilt 41γ.

In a second growth step (shown in FIG. 2C), metal atoms are ejected from target 2 to react with a gas species and to be received by the first portion 41 already deposited on the substrate 4. In the second growth step, the target 2 may be positioned such that the second incidence angle is smaller than the first incidence angle α (e.g., is between normal and the first incidence angle α). For example, the second incidence angle may be about 0 degrees (i.e., normal to the surface of the substrate 4). The deposition flux 10 in the second growth step form a second portion 42 of the bulk layer 40 (shown in FIG. 2D). The crystals of the second portion 42 of the bulk layer 40 have a c-axis tilt 42γ. The second growth step may be done without a collimator.

According to an embodiment, the c-axis tilt 42γ of the second portion 42 follows or substantially follows the c-axis tilt 41γ of the first portion 41 of the bulk layer 40. In some embodiments, the c-axis tilt 41γ, 42γ of the first and second portions 41, 42 aligns or at least substantially aligns with the first incidence angle α used during the first growth step. The resulting bulk layer crystals of the first portion 41 and second portion 42 may be substantially parallel to one another and at least substantially align with the desired c-axis tilt. The resulting bulk layer crystals of the first portion 41 and second portion 42 may also be substantially parallel within each portion. For example, at least 50%, at least 75%, or at least 90% of the crystals of the first portion 41 may have a c-axis tilt 41γ that is within 0 degrees to 10 degrees of the average c-axis tilt, and a direction that is within 0 degrees to 45 degrees, or within 0 degrees to 20 degrees of the average crystal direction. Similarly, at least 50%, at least 75%, or at least 90% of the crystals of the second portion 42 may have a c-axis tilt 42γ that is within 0 degrees to 10 degrees of the average c-axis tilt, and a direction that is within 0 degrees to 45 degrees, or within 0 degrees to 20 degrees of the average crystal direction.

FIGS. 3A-3D illustrate a process in which the bulk layer 50 is deposited on a seed layer 31, which has been deposited on the substrate 4. A first portion 51 of a crystalline bulk layer 50 (FIG. 3B) is deposited onto the seed layer 31 in the first growth step shown in FIG. 3A. In the first growth step, the atoms in the deposition flux 10 (metal atoms reacted with a gas) are deposited at a first incidence angle α. In a second growth step, shown in FIG. 3C, the atoms in the deposition flux 10 are deposited at a second incidence angle (3, resulting in the second portion 52 of the bulk layer 50. The second incidence angle θ may be smaller than the first incidence angle α. For example, the second incidence angle θ may be about 0 degrees (i.e., normal to the surface of the substrate 4). The crystals of the second portion 52 of the bulk layer 50 have a c-axis tilt 52γ.

According to an embodiment, the c-axis tilt 52γ of the second portion 52 follows or substantially follows the c-axis tilt 51γ of the first portion 51 of the bulk layer 50. In some embodiments, the c-axis tilt 51γ, 52γ of the first and second portions 51, 52 aligns or at least substantially aligns with the first incidence angle α used during the first growth step. The resulting bulk layer crystals of the first portion 51 and second portion 52 may be substantially parallel to one another and at least substantially align with the desired c-axis tilt. The resulting bulk layer crystals of the first portion 51 and second portion 52 may also be substantially parallel within each portion. For example, at least 50%, at least 75%, or at least 90% of the crystals of the first portion 51 may have a c-axis tilt 51γ that is within 0 degrees to 10 degrees of the average c-axis tilt, and a direction that is within 0 degrees to 45 degrees, or within 0 degrees to 20 degrees of the average crystal direction. Similarly, at least 50%, at least 75%, or at least 90% of the crystals of the second portion 52 may have a c-axis tilt 52γ that is within 0 degrees to 10 degrees of the average c-axis tilt, and a direction that is within 0 degrees to 45 degrees, or within 0 degrees to 20 degrees of the average crystal direction.

Both of the methods shown in FIGS. 2A-2D and 3A-3D may employ a collimator 17 in the first growth step (see FIGS. 2A and 3A), which includes positioning a target 2 at an off-normal incidence relative to the substrate 4. The second step (see FIGS. 2C and 3C), in which the second portion 42, 52 of the bulk layer 40, 50 is deposited at about normal incidence preferably does not employ a collimator.

According to at least some embodiments of the present disclosure, the bulk layer 40, 50 has a c-axis tilt that can be pre-selected. The methods of the present disclosure result in a bulk layer 40, 50 where the crystals of the bulk layer align with or substantially align with the pre-selected c-axis tilt. In some embodiments, the distribution of the c-axis tilt of the crystals is such that at least 75%, at least 80%, at least 85%, at least 90%, or at least 95% of the crystals in the bulk layer have a c-axis tilt that is within a range of the pre-selected c-axis tilt, such as within 1 to 10 degrees, within 1 to 8 degrees, within 1 to 5 degrees, or within 1 to 3 degrees of the pre-selected c-axis tilt.

Without wishing to be bound by theory, it is hypothesized that the deposition conditions during at least one growth step may be selected such that the deposition conditions retard the surface mobility of the atoms being deposited. The deposition conditions that may have a surface mobility retarding effect include many variables. These variables may be selected so that surface mobility is decreased to the point that the c-axis tilt of the seed layer and/or bulk layer can be controlled. The surface mobility of the atoms is a result of the variables as a whole, and not necessarily any single variable alone. When compared to conventional methods and deposition conditions for depositing bulk layers, each of the variables may be somewhat different, or only some of the variables may be different while others may remain the same as in conventional methods. Because surface mobility of atoms is difficult to determine directly, the combination of appropriate conditions may be determined based on the ability to change the c-axis tilt of the resulting crystalline layer beyond the angle(s) that is typically available for a deposited material due to crystallographic restrictions. For example, in the case of AlN, the ability to produce a crystalline layer with a c-axis tilt aligned along 32 degrees (with distribution of angles ranging from about 25 to about 35 degrees) or greater may indicate deposition conditions that favor kinetics over thermodynamics and that allow crystal growth to respond to changes in the deposition environment. Also, the ability to deposit a bulk layer directly onto a substrate (without a seed layer) at a c-axis tilt angle aligned along 20 degrees, above 25 degrees, above 30 degrees, or above 35 degrees may indicate deposition conditions that favor kinetics over thermodynamics. The crystals in the bulk layer may be aligned or substantially aligned over the area of the substrate (e.g., over the entire deposition area).

According to an embodiment, an initial (e.g., first) portion of the bulk layer may be deposited under the initial deposition conditions at an off-normal incidence angle such that crystals in the resulting initial bulk layer have the desired c-axis tilt. The remaining bulk layer (e.g., a second or subsequent portion) may be deposited under the same initial deposition conditions, or under different deposition conditions (e.g., conditions typically used for bulk layer deposition).

In some embodiments, bulk acoustic wave resonator structures and methods for fabricating such resonator structures include deposition of the bulk layer directly on the substrate (without a seed layer). Improved coupling efficiency and mechanical quality factor may result from the elimination of the seed layer, even when the seed layer might be formed from the same material as the bulk layer. In some embodiments, the resonator structures are formed by depositing the bulk layer directly on the substrate, and exhibit an improved mechanical quality factor, reduced acoustic losses, reduced ohmic (electrical) losses high shear strength, high ratio of shear coupling to longitudinal coupling, and/or low variation in resonance frequency and dry gain. The resonator structures also exhibit increased uniformity of the c-axis tilt angle over large areas.

According to at least some embodiments of the present disclosure, the c-axis tilt of the bulk layer may be adjusted by depositing a first portion of the bulk layer at the desired angle under initial deposition conditions. According to some embodiments, the initial deposition conditions are such that they retard the surface mobility of atoms while the bulk layer is being deposited. In at least some embodiments, the bulk layer with a pre-selected c-axis tilt can be deposited under the initial deposition conditions without first depositing a seed layer.

In some embodiments, the initial deposition conditions during the first growth step may include one or more of incidence angle, pressure, temperature, distance from the target to the substrate, and gas ratio. The incidence angle may be an off-normal incidence. For example, the incidence angle may be greater than 10 degrees, greater than 27 degrees, greater than 30 degrees, greater than 32 degrees, greater than 33 degrees, greater than 34 degrees, greater than 35 degrees, greater than 36 degrees, or greater than 40 degrees. The incidence angle may be up to about 85 degrees, up to about 75 degrees, up to about 65 degrees, up to about 56 degrees, up to about 52 degrees, up to about 50 degrees, up to about 49 degrees, or up to about 48 degrees. Illustrative incidence angles include 35 degrees, 40 degrees, 43 degrees, and 46 degrees. In some embodiments, the incidence angle is less than 32 degrees or greater than 40 degrees.

The pressure during the first growth step may be at least about 0.5 mTorr, at least about 1 mTorr, or at least about 1.5 mTorr. The pressure may be up to about 10 mTorr, up to about 8 mTorr, up to about 6 mTorr, up to about 5 mTorr, or up to about 4 mTorr. In some embodiments, the pressure is below 5 mTorr. For example, the pressure may be about 2 mTorr, about 2.5 mTorr, about 3 mTorr, about 3.5 mTorr, or about 4 mTorr. The temperature may be at least about 20° C., at least about 50° C., or at least about 100° C. The temperature may be up to about 300° C., up to about 250° C., or up to about 200° C. In some embodiments, the deposition process may generate heat but the deposition chamber in which the deposition is performed is not heated by a heater (i.e., is not intentionally heated).

The distance from the target to the substrate during the first growth step may be at least about 50 mm, at least about 75 mm, at least about 80 mm, or at least about 90 mm. The distance may be up to about 200 mm, up to about 150 mm, up to about 130 mm, or up to about 120 mm. In some embodiments, the distance from the target to the substrate during deposition may be about 108 mm to about 115 mm.

The gases in the vapor space of the deposition system may be selected based on the intended composition of the deposited layer, and may include argon and a gas that reacts with the deposited atoms, such as nitrogen or oxygen. The gas ratio of argon to reacting gas (e.g., nitrogen) in the vapor space may be from about 1:10 to about 10:10, from about 2:10 to about 8:10, or about 4:10.

In some embodiments, bulk acoustic wave resonator structures and methods for fabricating such resonator structures include deposition of the bulk layer onto a seed layer. A seed layer can be used to provide a textured surface for depositing the bulk layer. The seed layer may exhibit different textures, most notably (103) and (002). A directional deposition flux and competitive column growth may result in a bulk layer with a c-axis substantially oriented along the deposition flux.

In certain embodiments, the crystalline seed layer is compositionally matched to the hexagonal crystal structure piezoelectric material bulk layer. In some embodiments, the thickness of the crystalline seed layer is no greater than about 20%, no greater than about 15%, or no greater than about 10% of the combined thickness of the bulk layer and seed layer. In certain embodiments, the seed layer includes a thickness in a range of from about 500 Angstroms to about 2,000 Angstroms, and (for a hexagonal crystal structure seed material such as AlN) may include a dominant (103) texture.

The seed layer may be prepared (e.g., deposited onto a substrate) according to known methods and conditions, such as those discussed in U.S. patent application Ser. No. 15/293,071 entitled "Methods for Fabricating Acoustic Structure with Inclined C-Axis Piezoelectric Bulk and Crystalline Seed Layers." In some embodiments, the seed layer is deposited at a pressure of 8 mTorr or greater, 10 mTorr or greater, or 12 mTorr or greater, and up to 25 mTorr, up to 20 mTorr, or up to 18 mTorr.

According to some embodiments, the bulk layer is deposited onto the seed layer in a first growth step during initial deposition conditions, which may include one or more of incidence angle, pressure, temperature, distance from the target to the substrate, and gas ratio.

The incidence angle of first growth step may be an off-normal incidence. For example, the incidence angle may be greater than 10 degrees, greater than 27 degrees, greater than 30 degrees, greater than 32 degrees, greater than 33 degrees, greater than 34 degrees, greater than 35 degrees, greater than 36 degrees, or greater than 40 degrees. The incidence angle may be up to about 85 degrees, up to about 75 degrees, up to about 65 degrees, up to about 56 degrees, up to about 52 degrees, up to about 50 degrees, up to about 49 degrees, or up to about 48 degrees. Illustrative incidence angles include 35 degrees, 40 degrees, 43 degrees, and 46 degrees. In some embodiments, the incidence angle is less than 32 degrees or greater than 40 degrees.

The pressure during the first growth step may be at least about 0.5 mTorr, at least about 1 mTorr, or at least about 1.5 mTorr. The pressure may be up to about 10 mTorr, up to about 8 mTorr, or up to about 6 mTorr. In some embodiments, the pressure is below 5 mTorr. For example, the pressure may be about 2 mTorr, about 2.5 mTorr, about 3 mTorr, about 3.5 mTorr, or about 4 mTorr. The temperature may be at least about 20° C., at least about 50° C., or at least about 100° C. The temperature may be up to about 300° C., up to about 250° C., or up to about 200° C. In some embodiments, the deposition process may generate heat but the deposition chamber in which the deposition is performed is not heated by a heater (i.e., is not intentionally heated).

The distance from the target to the substrate during deposition may be at least about 50 mm, at least about 75 mm, at least about 80 mm, or at least about 90 mm. The distance may be up to about 200 mm, up to about 150 mm, up to about 130 mm, or up to about 120 mm. In some embodiments, the distance from the target to the substrate during deposition may be about 108 mm to about 115 mm.

The gases in the vapor space of the deposition system may be selected based on the intended composition of the deposited layer, and may include argon and a gas that reacts with the deposited atoms, such as nitrogen or oxygen. The gas ratio of argon to reacting gas (e.g., nitrogen) in the vapor space may be from about 1:10 to about 10:10, from about 2:10 to about 8:10, or about 4:10.

The surface onto which the seed layer, the bulk layer, or a portion of the bulk layer is deposited may optionally be roughened prior to deposition. For example, the surface of the substrate, the surface of the seed layer, or the surface of the first portion of the bulk layer may be roughened. The surface may be roughened by, for example, atomic bombardment. Roughening of the surface may improve the ability of the subsequently grown bulk layer crystals to orient during the deposition. Without wishing to be bound by theory, it is believed that roughening the surface causes shadowing effects, which may help favor orientation of the crystals toward the angle of deposition. The surface of the substrate may be roughened by, for example, atomic bombardment, creating "hills" and "valleys" on the surface.

According to certain embodiments, a second portion of the bulk layer is deposited at normal incidence, or at an incidence angle that is between the first incidence and a normal to the plane of the substrate. The ability to deposit a portion, or a majority, of the bulk layer (e.g., the second portion of the bulk layer) at a normal incidence may make manufacturing faster and more efficient. In addition, depositing at a normal incidence may cause less material to be deposited on the collimator.

The deposition conditions during the second growth step may include the incidence angle and one or more of pressure, temperature, distance from the target to the substrate, and gas ratio. The second incidence angle may be about 0 degrees, up to about 5 degrees, up to about 10 degrees, up to about 15 degrees, up to about 20 degrees, up to about 25 degrees, up to about 30 degrees, up to about 35 degrees, or up to about 40 degrees.

The deposition conditions during the second growth step may be the same as the initial deposition conditions or may be different. The deposition conditions during the second growth step may include, for example, a pressure of about 0.5 mTorr to about 15 mTorr, from about 0.8 mTorr to about 10 mTorr, or from about 1 mTorr to about 5 mTorr. In some embodiments, the pressure is below 5 mTorr. For example, the pressure may be about 2 mTorr, about 2.5 mTorr, about 3 mTorr, about 3.5 mTorr, or about 4 mTorr. The temperature during the second growth step may range from about 20° C. to about 300° C., from about 50° C. to about 250° C., or from about 100° C. to about 200° C. The gas ratio of argon to reacting gas (e.g., nitrogen) in the vapor space may be from about 1:10 to about 10:10, from about 2:10 to about 8:10, or about 4:10.

The materials used in the first and second growth steps may be the same or may be different. Suitable materials for the bulk layer include piezoelectric materials or other metallic materials with a high melting point. In some embodiments the material includes a metal nitride, such as aluminum nitride, titanium nitride, hafnium nitride, tantalum nitride, zirconium nitride, vanadium nitride, niobium nitride, etc. In some embodiments the material includes a metal oxide, such as zinc oxide, tungsten oxide, hafnium oxide, molybdenum oxide, etc. In some embodiments, the material comprises a metal oxynitride, such as hafnium oxynitride, titanium oxynitride, tantalum oxynitride, etc. In some embodiments the material includes a metal carbide such as titanium carbide, niobium carbide, tungsten carbide, tantalum carbide, etc. In some embodiments the material is a refractory metal, such as zirconium, hafnium, tungsten, molybdenum, etc. The bulk layer may comprise a combination of two or more of the material described above.

In certain embodiments, a hexagonal crystal structure piezoelectric material bulk layer comprises a c-axis having an orientation distribution predominantly in a range of from 12 degrees to 52 degrees, or in a range of from 27 degrees to 37 degrees, or in a range of from 75 degrees to 90 degrees, relative to normal of a face of a substrate or wafer supporting the hexagonal crystal structure piezoelectric material bulk layer.

The distribution of the c-axis orientation of the hexagonal crystal structure piezoelectric material bulk layer may be normal or bimodal. In a preferred embodiment, the distribution is normal. In certain embodiments, less than about 30%, less than about 25%, or less than about 20% of the c-axis orientation distribution of the hexagonal crystal structure piezoelectric material bulk layer is in a range of from 0 degrees to 25 degrees relative to normal of a face of the substrate. In certain embodiments, less than about 30%, less than about 25%, or less than about 20% of the c-axis orientation distribution of the hexagonal crystal structure piezoelectric material bulk layer is in a range of from 45 degrees to 90 degrees relative to normal of a face of the substrate. At least 60%, at least 65%, at least 70%, at least 75%, at least 80%, at least 85%, or at least 90% of the c-axis orientation distribution of the hexagonal crystal structure piezoelectric material bulk layer may be in a range of 25 degrees to 45 degrees. In some embodiments, at least 60%, at least 65%, at least 70%, at least 75%, at least 80%, at least 85%, or at least 90% of the c-axis orientation distribution of the hexagonal crystal structure piezoelectric material bulk layer is in a range of 30 degrees to 40 degrees.

The hexagonal crystal structure piezoelectric material bulk layer also has a bulk grain orientation which is distinct from the c-axis tilt. The bulk grain orientation of the first portion the bulk layer may be different from the second portion of the bulk layer. In some embodiments, the bulk grain orientation of the second portion may be vertical or substantially vertical. For example, the bulk grain orientation of the second portion may be up to 15°, up to 10°, or up to 5° from the normal of the face of the substrate.

In certain embodiments, the hexagonal crystal structure piezoelectric material bulk layer (combined first and second portions) may have a thickness of about 1,000 Å (Angstrom) or greater, about 2,000 Å or greater, about 3,000 Å or greater, about 4,000 Å or greater, about 6,000 Å or greater, or about 10,000 Å or greater. The thickness of the hexagonal crystal structure piezoelectric material bulk layer may be up to about 30,000 Å, up to about 26,000 Å, or up to about 20,000 Å. Such hexagonal crystal structure piezoelectric material bulk layer preferably includes substantially uniform thickness, nanostructure, and crystallinity properties, with controlled stress and densely packed columnar grains or recrystallized grain structure. In certain embodiments, a crystalline seed layer includes a thickness in a range of from 500 Å to 2,000 Å, and (for a hexagonal crystal structure piezoelectric material such as AlN) may include a dominant (103) texture. In other embodiments, the structure does not include a seed layer.

Variations in the thickness of the bulk layer may be reduced as compared to prior art methods. According to some embodiments, the hexagonal crystal structure piezoelectric material bulk layer exhibits variations in film thickness of 2.0% or less, 1.9% or less, 1.8% or less, or 1.7% or less.

The hexagonal crystal structure piezoelectric material bulk layer may also exhibit reduced surface roughness. According to some embodiments, the hexagonal crystal structure piezoelectric material bulk layer has an outer surface with a surface roughness of (Ra) of 4.5 nm or less, 4.2 nm or less, 4.0 nm or less, 3.8 nm or less, or 3.8 nm or less.

According to some embodiments, an acoustic resonator structure is prepared in a deposition system where at least one wafer comprising a substrate is received by a support surface. An acoustic reflector structure may be arranged over the substrate, and an electrode structure arranged over at least a portion of the acoustic reflector structure—such as may be useful to produce at least one solidly mounted bulk acoustic wave resonator device. In certain other embodiments, the at least one wafer includes a substrate defining a recess, a support layer is arranged over the recess, and an electrode structure is arranged over the support layer—such as may be useful to produce at least one film bulk acoustic wave resonator device. In describing the method here, deposition simply onto "a substrate" may be described. However, it is to be understood that the substrate may be a part of a resonator device complex or wafer, which may also include other components, such as an electrode structure arranged over at least a portion of the substrate.

Multiple acoustic resonator structures or devices (for example, a batch of devices) may be prepared from a single wafer made according to methods of the present disclosure. The batch of devices may be made to particular specifications and quality parameters. Such specifications and quality parameters may include, among other things, operating resonance frequency, variance in resonance frequency across the batch, and variance in dry gain (mass sensitivity) across the batch. Variance in resonance frequency may be understood as the difference in actual frequency as compared to a nominal or target frequency among the batch. Variance in dry gain may be understood as the difference in dry gain under given test conditions across the batch. It has been found that the dry gain of an acoustic resonator structure positively correlates with device resonance frequency. Therefore, the variance in dry gain in a batch of acoustic resonator structures made from a given wafer also positively correlates with the variance in resonance frequency across the batch. According to an embodiment, variance in dry gain may be reduced by depositing a more uniform bulk layer. Thus, acoustic resonator structures prepared according to the present disclosure may exhibit lower variance in series resonance frequency (fs) and lower variance in dry gain, as compared to prior art structures.

In some embodiments, a plurality of acoustic resonator structures (e.g., BAW devices) prepared from a single wafer exhibit a variance of resonance frequency of +/−100 MHz or less, +/−90 MHz or less, or +/−80 MHz or less, compared to a nominal frequency. The dry gain variance of the plurality of acoustic resonator structures may be 10% or less, 8% or less, 6% or less, 4% or less, 2% or less, 1.9% or less, or 1.8% or less, under test conditions. It may be assumed that the test conditions for the batch of structures are the same across the batch. In some embodiments, any number of acoustic resonator structures may be prepared from a single wafer. For example, the wafer may be made into 100 or greater, 1,000 or greater, or 10,000 or greater acoustic resonator structures, and up to 100,000 acoustic resonator structures. Any two or more of the structures may be tested and may exhibit the stated variance in resonance frequency and variance in dry gain. The acoustic resonator structures may have any suitable operating frequency, such as a frequency of 2 GHz or greater, 2.5 GHz or greater, 2.75 GHz or greater, or 3 GHz or greater. In some embodiments, the plurality of acoustic resonator structures are BAW devices with an operating frequency in the range of 2 GHz to 3 GHz.

In one exemplary embodiment, a wafer is prepared by depositing a bulk material layer according to methods of the present disclosure. A batch of BAW resonators is manufactured from the wafer. The BAW resonators have a nominal resonance frequency of about 2.7 GHz. Any two or more BAW resonators from the batch may be tested and may exhibit a variance of resonance frequency of +/−100 MHz or less. In other words, the tested BAW resonators may exhibit a resonance frequency between 2.6 GHz and 2.8 GHz. Any two or more BAW resonators from the batch may be tested under test conditions and may exhibit a variance in dry gain of 10% or less. In other words, the dry gain of the tested devices is within 10% of one another.

Various devices, such as BAW resonators, made from the acoustic resonator structures of the present disclosure may exhibit greater mechanical strength than as compared to prior art devices. The device structure may include a bump disposed at least partially on the bulk material layer. Bump structures are pillars constructed to make electrical contacts to the piezo surfaces. During use of the device, the bump may be subject to shear forces. Therefore, a higher shear strength and the ability to withstand higher shear forces is beneficial. The bump shear strength is dependent on various factors, such as bump diameter, height, and underlying stack configuration. Bumps constructed on stacks made using the methods of the present disclosure may exhibit higher shear strength compared to similar bumps constructed on stacks made using prior art methods. According to an embodiment, bump structures prepared on the acoustic resonator structures may exhibit a shear strength (measured using a bond shear measurement tool) that can resist forces of 80 g or greater, 100 g or greater, 110 g or greater, 120 g or greater, 125 g or greater, 130 g or greater, 135 g or greater, or 140 g or greater. While there is no desired upper limit to the ability to withstand shear forces, in practice, the bump structures may be able to withstand shear forces of up to 500 g, up to 400 g, up to 300 g, up to 250 g, or up to 200 g. The improved mechanical strength may result in improved performance during use of the device, but also in improved process throughput and lower process cost during manufacturing.

In one aspect, the disclosure relates to a method for fabricating at least one acoustic resonator structure, wherein a growth step (e.g., a first growth step and a second growth step) includes deposition of a hexagonal crystal structure bulk layer on a substrate. The deposited material may be piezoelectric material. The growth step includes ejection of metal atoms from a target surface of a linear sputtering apparatus to react with a gas species and to be received by the substrate.

The acoustic resonator structures prepared according to methods of the present disclosure, and devices made using such acoustic resonator structures, may be more robust and exhibit improved mechanical stability as compared to structures prepared using previously known methods.

The seed and bulk layers of the present disclosure can be prepared in any suitable deposition system. One example of a suitable deposition system is described in U.S. patent application Ser. No. 15/293,063 entitled "Deposition System for Growth of Inclined C-Axis Piezoelectric Material Structures." The main aspects of the deposition system are summarized below. However, the methods of the present disclosure are not particularly limited by the system used, and other suitable systems may also be used.

The crystalline layers of the present disclosure can be prepared in a deposition system incorporating a multi-aperture collimator arranged between a target surface of a linear sputtering apparatus and a substrate table that supports one or more wafers or substrates for receiving sputter-deposited material. In some embodiments, the wafers or substrates may be placed on a stationary pedestal for deposition at normal incidence (0 degrees).

Figure 4:
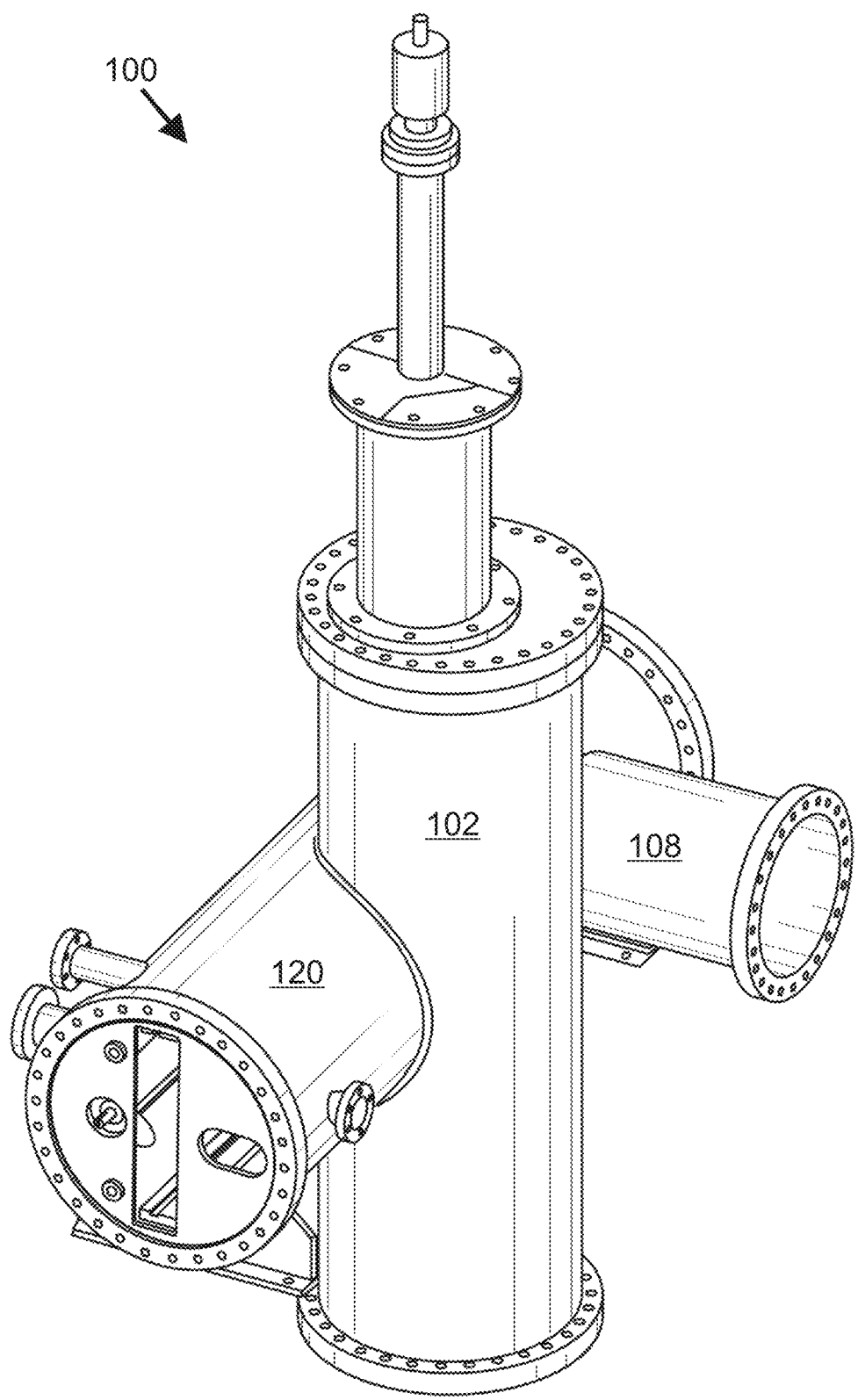
FIG. 4 is an upper exterior perspective view of a reactor of a deposition system for growing a hexagonal crystal structure piezoelectric material with an inclined c-axis, the system including a linear sputtering apparatus, a movable substrate table for supporting multiple substrates, and a collimator.
Figure 5:
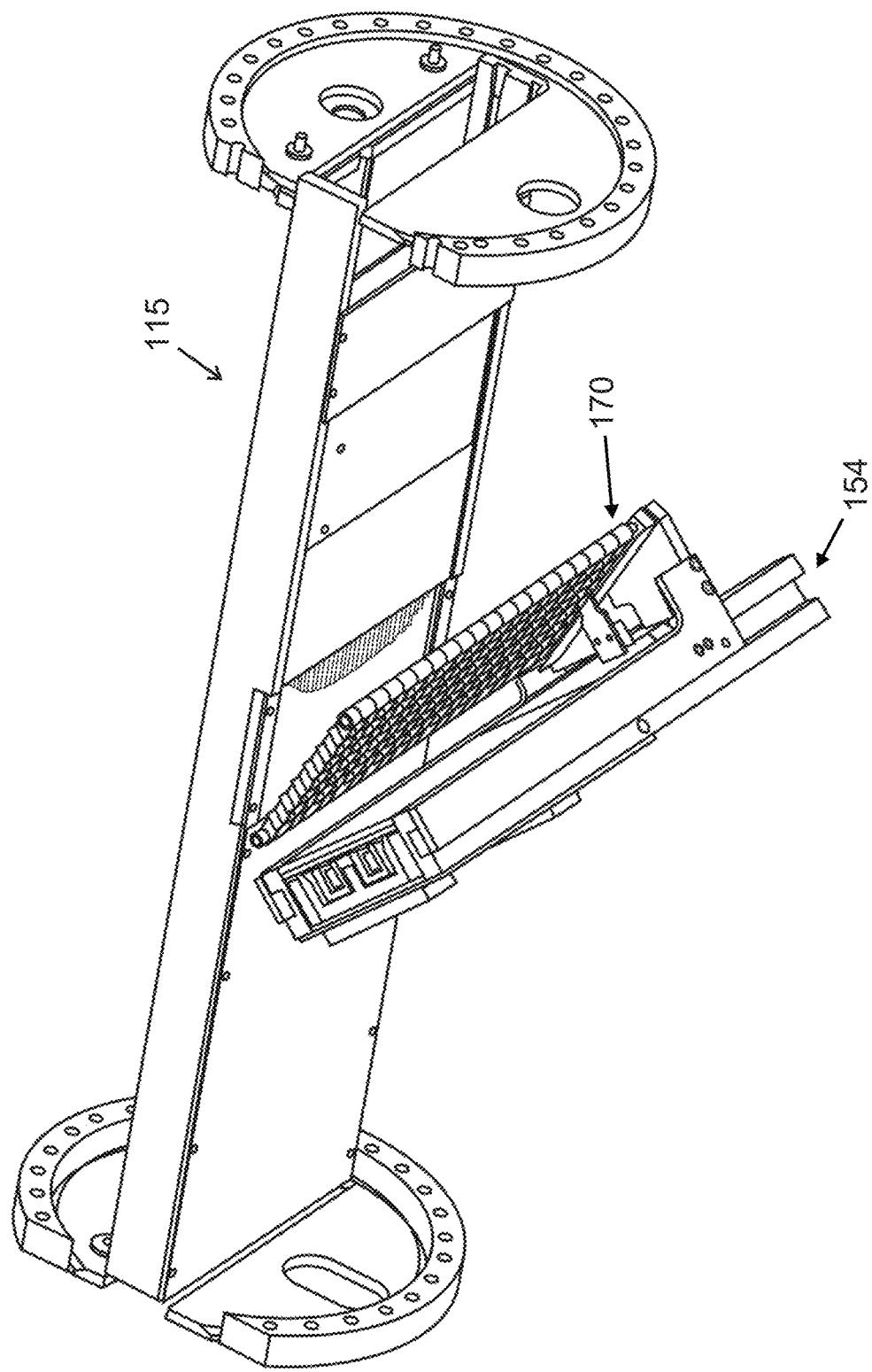
FIG. 5 is an upper perspective view of some of the elements of the reactor of FIG. 4, including a linear sputtering apparatus, a translation track for translating a movable substrate table for supporting multiple substrates, and a collimator.

An exemplary deposition system is shown in FIG. 4, which is an upper exterior perspective view of the reactor 100 of the deposition system for growing hexagonal crystal structure piezoelectric materials. The reactor 100 includes first, second, and third tubular portions 102, 120, 108 for housing various elements used for depositing material onto a substrate. FIG. 5 depicts an upper perspective view of some of the elements of the reactor 100, including a linear sputtering apparatus 154, a translation track 115 for translating a movable substrate table for supporting multiple substrates, and a collimator assembly 170.

The target surface may be non-parallel to the substrate table, and the intermediately arranged collimator may be non-parallel to both the target surface and the substrate table. The collimator and the substrate table are preferably both capable of movement (e.g., translation) during sputtering, and at least one of the substrate table or the collimator is preferably biased to an electrical potential other than ground. The system may be used to grow (e.g., deposit) a crystalline seed layer, followed by growth of a hexagonal crystal structure piezoelectric material bulk layer over the crystalline seed layer under conditions that differ from the seed layer deposition. Alternatively, according to a method of the present disclosure, the bulk layer may be deposited directly onto the substrate without first depositing a seed layer.

According to an embodiment, the bulk layer is grown (e.g., deposited) using a single sputtering apparatus. The growth step (e.g., the first and/or second growth step) may be performed with a deposition system utilizing a linear sputtering apparatus, a substrate table that is translatable between different positions within the linear sputtering apparatus, and a collimator arranged between the substrate table and the linear sputtering apparatus. A hexagonal crystal structure piezoelectric material bulk layer may be grown in an enclosure in which subatmospheric conditions may be generated using at least one vacuum pumping element, and a wafer or substrate supporting the bulk layer may be translated within the enclosure.

In some embodiments, the bulk layer is grown (e.g., deposited) in two or more steps which may be performed with a deposition system utilizing multiple linear sputtering apparatuses, a substrate table that is translatable between different positions proximate to different linear sputtering apparatuses. A collimator may be arranged between the substrate table and the respective linear sputtering apparatuses. For example, a crystalline seed layer and/or a first portion of a hexagonal crystal structure piezoelectric material bulk layer may be grown by reactive sputtering at a first station using a first collimator according to a first growth step, and a hexagonal crystal structure piezoelectric material bulk layer (or a second portion of the bulk layer) may be grown by reactive sputtering at a second station without a collimator in a second growth step. Both stations may be located in a single enclosure in which subatmospheric conditions may be generated using at least one vacuum pumping element, and a wafer or substrate supporting the respective layers may be moved between the stations without need for removal from subatmospheric conditions. In some embodiments, different process conditions and/or different angular positions between target surfaces, collimator, and a wafer or support surface may be used in the first and second growth steps.

The deposition system suitable for growing tilted c-axis hexagonal crystal structure piezoelectric material may include a linear sputtering apparatus, a multi-aperture collimator, and a translatable substrate table having a support surface arranged non-parallel to a target surface of the sputtering apparatus, with the substrate table and/or the collimator being electrically biased to a potential other than ground. The linear sputtering apparatus, which may include a linear magnetron or a linear ion beam sputtering apparatus, includes a target surface configured to eject metal (e.g., aluminum or zinc) atoms, with the target surface being non-parallel to (e.g., oriented at 0 to less than 90 degrees from) the support surface. The collimator may also be arranged non-parallel to the support surface. In certain embodiments, e.g., during the first growth step, a target surface is arranged at a first nonzero angle relative to a support surface, and a collimator is arranged at a second nonzero angle relative to the support surface, wherein the first nonzero angle is greater than the second nonzero angle. Metal atoms ejected from the target surface react with a gas species contained in a gas-containing environment to form the material to be deposited (e.g., piezoelectric material). For example, aluminum atoms ejected from an aluminum or aluminum-containing target surface may react with nitrogen gas species to form aluminum nitride, or zinc atoms ejected from a zinc or zinc-containing target surface may react with oxygen gas species to form zinc oxide.

The support surface of the substrate table may be configured to receive one or more wafers to be used as deposition substrates, preferably having a diameter in a range of at least about 50 mm, about 100 mm, or about 150 mm. The substrate table may be coupled to a movable element (e.g., a translation element) configured to move the substrate table during operation of the linear sputtering apparatus. Movement of the substrate table may promote uniform material deposition over large areas by preventing localized material deposition regions of different thicknesses. The exemplary collimator includes multiple guide members arranged non-parallel to the support surface, such as a plurality of longitudinal members and a plurality of transverse members, that form a grid defining multiple collimator apertures. Electrical biasing of the substrate table and/or the collimator to a potential other than ground enhances control of material deposition during operating of the sputtering apparatus. Collimator biasing may also influence microstructure development of tilted c-axis piezoelectric bulk material in a bulk acoustic wave resonator device. The substrate table and the collimator may be independently biased to electrical potentials other than ground. Separate guide members of the collimator may also be electrically biased differently relative to one another. The collimator may be configured to translate during operation of the linear sputtering apparatus to prevent formation of a "shadow" pattern that could otherwise be formed on a surface receiving deposited piezoelectric material. A deposition aperture may be arranged between the collimator and the substrate table.

According to at least some embodiments, the c-axis tilt of the resulting bulk layer is the same as the preselected angle or is within a range of the incidence angle and/or the preselected angle. For example, the c-axis tilt of the resulting bulk layer may be within 1 degree, within 2 degrees, within 3 degrees, within 5 degrees, within 10 degrees, or within 15 degrees of the incidence angle and/or the preselected c-axis tilt. The distribution of the c-axis tilt of the bulk layer crystals may be such that at least 75%, at least 80%, at least 85%, at least 90%, or at least 95% of the crystals in the bulk layer have a c-axis tilt that is within a range, such as within 1 degree, within 2 degrees, within 3 degrees, within 5 degrees, within 10 degrees, or within 15 degrees, of the incidence angle and/or the pre-selected c-axis tilt.

In certain embodiments, a substrate table and/or collimator is configured to translate during the first and/or second growth steps to promote uniform material deposition. An electrode structure may be formed over at least one portion of the hexagonal crystal structure piezoelectric material bulk layer to form at least one bulk acoustic wave resonator device. An active region of bulk acoustic wave resonator device is provided in an area in which the hexagonal crystal structure piezoelectric material bulk layer is arranged between a first electrode structure and a second electrode structure. Such growth steps may be performed using a single sputtering apparatus or a deposition system utilizing multiple linear sputtering apparatuses, a substrate table that is translatable between different positions proximate to different linear sputtering apparatuses, and optionally a collimator arranged between the substrate table and the respective linear sputtering apparatuses. In certain embodiments, at least one resonator device complex, over which the hexagonal crystal structure piezoelectric material bulk layer is deposited, is diced into a plurality of chips, such as solidly mounted bulk acoustic wave resonator chips or film bulk acoustic wave resonator chips.

In another aspect of the present disclosure, a method for fabricating at least one resonator structure includes use of a first station containing a first linear sputtering apparatus including a first target surface, and use of a second station containing a second linear sputtering apparatus including a second target surface. At least one wafer structure supported by a substrate table is moved to the first station in which a first subatmospheric pressure condition is generated, a first growth step is performed to deposit a first portion of a hexagonal crystal structure piezoelectric material bulk layer over the at least one wafer structure, the at least one wafer structure supported by the substrate table is moved to the second station in which a second subatmospheric pressure is generated, and a second growth step is performed to deposit a second portion of a hexagonal crystal structure piezoelectric material bulk layer over the first portion of the bulk layer, wherein the second portion of the hexagonal crystal structure piezoelectric material bulk layer has a c-axis orientation distribution that is substantially similar to the c-axis orientation distribution of the first portion of the hexagonal crystal structure piezoelectric material bulk layer. The first growth step includes ejection of metal atoms from the first target surface to (i) transit through a first deposition aperture (optionally preceded by transit through a first collimator including multiple first collimator apertures), and (ii) react with a gas species and be received by the at least one wafer structure, to deposit the first portion of the hexagonal crystal structure piezoelectric material bulk layer. The second growth step includes ejection of metal atoms from the second target surface to (i) transit through a second deposition aperture, and (ii) react with a gas species and be received by the first portion, to deposit the second portion of the hexagonal crystal structure piezoelectric material bulk layer. The second growth step may or may not involve using a collimator. In certain embodiments, the first growth step is configured to yield a first portion of the hexagonal crystal structure piezoelectric material bulk layer having an orientation distribution predominantly within a range (e.g., within ±5 degrees or within ±10 degrees) of the preselected angle; and the second growth step is configured to yield a second portion of the hexagonal crystal structure piezoelectric material bulk layer including a c-axis having an orientation distribution predominantly within a range (e.g., within ±5 degrees or within ±10 degrees) of the same preselected angle. Predominantly is intended to mean at least 50%, at least about 75%, at least about 90%, or at least about 95% of the crystals in the layer.

In certain embodiments, the substrate table supporting the at least one wafer structure is loaded into a load lock chamber, and an initial subatmospheric condition is generated in the load lock chamber, prior to the moving of the at least one wafer structure supported by the substrate table to the first station. In certain embodiments, the first station and the second station are arranged within a single enclosure in which the first subatmospheric pressure condition and the second subatmospheric pressure condition are generated. In other embodiments, the first station is arranged within a first chamber having an associated first vacuum pumping element, and the second station is arranged within a second chamber having an associated second vacuum pumping element.

In certain embodiments, the substrate has a diameter of at least about 50 mm (or at least about 100 mm, or at least about 150 mm) and the hexagonal crystal structure piezoelectric material bulk layer covers at least about 50% (or at least about 75%, or at least about 90%, or at least about 95%) of a face of the substrate. In certain embodiments, multiple bulk acoustic wave resonator devices each including an active region between a first electrode structure and a second electrode structure are provided on a single substrate. Multiple bulk acoustic resonator chips may be derived from such a substrate (e.g., by dicing), and may be incorporated in one or more sensors and/or fluidic devices.

In one embodiment, the deposition system is configured for growth of a hexagonal crystal structure piezoelectric material bulk layer directly over a substrate (without first depositing a seed layer). In another embodiment, the deposition system is configured for growth of a hexagonal crystal structure piezoelectric material bulk layer onto a seed layer disposed on a substrate. The substrate may be a wafer received by the support surface, wherein at least 50% (or at least 75%, or at least 90%, or at least 95%) of the hexagonal crystal structure piezoelectric material bulk layer comprises a c-axis having an orientation distribution predominantly in a range of from 25 degrees to 50 degrees (or in a subrange of from 30 degrees to 40 degrees with a peak at about 35 degrees), or greater than 10 degrees, greater than 27 degrees, greater than 30 degrees, greater than 32 degrees, greater than 33 degrees, greater than 34 degrees, greater than 35 degrees, greater than 36 degrees, or greater than 40 degrees, relative to normal of a face of a substrate or wafer received by the support surface. The orientation distribution may be up to about 85 degrees, up to about 80 degrees, up to about 75 degrees, up to about 65 degrees, up to about 56 degrees, up to about 52 degrees, up to about 50 degrees, up to about 49 degrees, or up to about 48 degrees. Such c-axis orientation distribution is preferably substantially uniform over the area of a large area substrate (e.g., having a diameter in a range of at least about 50 mm, about 100 mm, or about 150 mm), thereby enabling multiple chips having the same or similar acoustic wave propagation characteristics to be derived from a single substrate.

The bulk layer grown according to the methods of this disclosure have a preselected c-axis tilt angle. The selection of the preselected c-axis tilt angle will depend on the desired or intended use of the resulting crystalline bulk layer structure (e.g., an acoustic resonator structure). For example, the preselected angle may be any angle greater than 0 degrees and less than 90 degrees. It may be desirable to select an angle that favors shear mode resonance. For example, the preselected angle may be greater than 10 degrees, greater than 27 degrees, greater than 30 degrees, greater than 32 degrees, greater than 33 degrees, greater than 34 degrees, greater than 35 degrees, greater than 36 degrees, or greater than 40 degrees. The preselected angle may be up to about 85 degrees, up to about 75 degrees, up to about 65 degrees, up to about 56 degrees, up to about 52 degrees, up to about 50 degrees, up to about 49 degrees, or up to about 48 degrees. Exemplary preselected angles include 35 degrees and 46 degrees. In some embodiments, the preselected angle is less than 32 degrees or greater than 46 degrees.

The piezoelectric material films with a bulk layer according to embodiments of the present disclosure can be used in various bulk acoustic wave ("BAW") devices, such as BAW resonators. Exemplary BAW resonators employing the piezoelectric material films of the present disclosure are shown in FIGS. 6-7.

Figure 6:
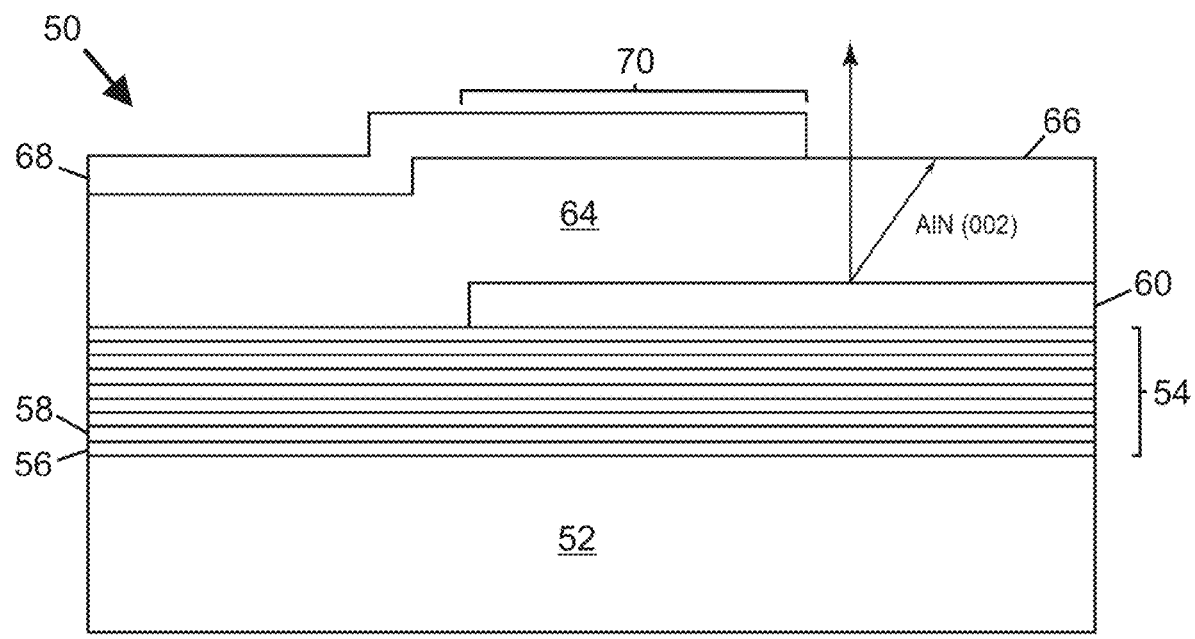
FIG. 6 is a schematic cross-sectional view of a portion of a bulk acoustic wave solidly mounted resonator device including an inclined c-axis hexagonal crystal structure piezoelectric material bulk layer as disclosed herein, with the resonator device including an active region with a portion of the piezoelectric material arranged between overlapping portions of a top side electrode and a bottom side electrode.

FIG. 6 is a schematic cross-sectional view of a portion of a bulk acoustic wave solidly mounted resonator device 50 including a piezoelectric material bulk layer 64 embodying an inclined c-axis hexagonal crystal structure piezoelectric material (e.g., AlN or ZnO) as disclosed herein. The c-axis (or (002) direction) of the piezoelectric material bulk layer 64 is tilted away from a direction normal to the substrate 52, as illustrated by two arrows superimposed over the piezoelectric material bulk layer 64. The resonator device 50 includes the substrate 52 (e.g., typically silicon or another semiconductor material), an acoustic reflector 54 arranged over the substrate 52, the piezoelectric material bulk layer 64, and bottom and top side electrodes 60, 68. The bottom side electrode 60 is arranged between the acoustic reflector 54 and the piezoelectric material bulk layer 64, and the top side electrode 68 is arranged along a portion of an upper surface 66 of the piezoelectric material bulk layer 64. An area in which the piezoelectric material bulk layer 64 is arranged between overlapping portions of the top side electrode 68 and the bottom side electrode 60 is considered the active region 70 of the resonator device 50. The acoustic reflector 54 serves to reflect acoustic waves and therefore reduce or avoid their dissipation in the substrate 52. In certain embodiments, the acoustic reflector 54 includes alternating thin layers 56, 58 of materials of different acoustic impedances (e.g., SiOC, $Si_3N_4$, $SiO_2$, AlN, and Mo), optionally embodied in a Bragg mirror, deposited over the substrate 52. In certain embodiments, other types of acoustic reflectors may be used. Steps for forming the resonator device 50 may include depositing the acoustic reflector 54 over the substrate 52, followed by deposition of the bottom side electrode 60, followed by growth (e.g., via sputtering or other appropriate methods) of the piezoelectric material bulk layer 64, followed by deposition of the top side electrode 68.

Figure 7:
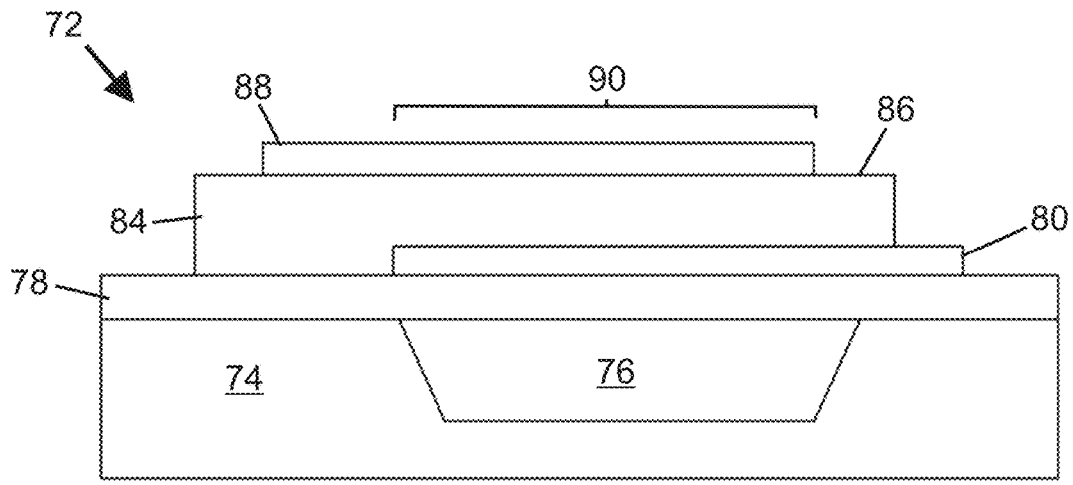
FIG. 7 is a schematic cross-sectional view of a film bulk acoustic wave resonator (FBAR) device according to one embodiment including an inclined c-axis hexagonal crystal structure piezoelectric material bulk layer arranged over a crystalline seed layer as disclosed herein, with the FBAR device including a substrate defining a cavity covered by a support layer, and including an active region registered with the cavity with a portion of the piezoelectric material arranged between overlapping portions of a top side electrode and a bottom side electrode.

FIG. 7 is a schematic cross-sectional view of a film bulk acoustic wave resonator (FBAR) device 72 according to one embodiment. The FBAR device 72 includes a substrate 74 (e.g., silicon or another semiconductor material) defining a cavity 76 that is covered by a support layer 78 (e.g., silicon dioxide). A bottom side electrode 80 is arranged over a portion of the support layer 78, with the bottom side electrode 80 and the support layer 78. A piezoelectric material bulk layer 84 embodying inclined c-axis hexagonal crystal structure piezoelectric material (e.g., AlN or ZnO) is arranged over the bottom side electrode 80, and a top side electrode 88 is arranged over at least a portion of a top surface 86 of the piezoelectric material bulk layer 84. A portion of the piezoelectric material bulk layer 84 arranged between the top side electrode 88 and the bottom side electrode 80 embodies an active region 90 of the FBAR device 72. The active region 90 is arranged over and registered with the cavity 76 disposed below the support layer 78. The cavity 76 serves to confine acoustic waves induced in the active region 90 by preventing dissipation of acoustic energy into the substrate 74, since acoustic waves do not efficiently propagate across the cavity 76. In this respect, the cavity 76 provides an alternative to the acoustic reflector 54 illustrated in FIGS. 6 and 7. Although the cavity 76 shown in FIG. 7 is bounded from below by a thinned portion of the substrate 74, in alternative embodiments at least a portion of the cavity 76 extends through an entire thickness of the substrate 74. Steps for forming the FBAR device 72 may include defining the cavity 76 in the substrate 74, filling the cavity 76 with a sacrificial material (not shown) optionally followed by planarization of the sacrificial material, depositing the support layer 78 over the substrate 74 and the sacrificial material, removing the sacrificial material (e.g., by flowing an etchant through vertical openings defined in the substrate 74 or the support layer 78, or lateral edges of the substrate 74), depositing the bottom side electrode 80 over the support layer 78, growing (e.g., via sputtering or other appropriate methods) the piezoelectric material bulk layer 84, and depositing the top side electrode 88.

In certain embodiments, an acoustic reflector structure is arranged between the substrate and the at least one first electrode structure to provide a solidly mounted bulk acoustic resonator device. Optionally, a backside of the substrate may include a roughened surface configured to reduce or eliminate backside acoustic reflection. In other embodiments, the substrate defines a recess, a support layer is arranged over the recess, and the support layer is arranged between the substrate and at least a portion of the at least one first electrode structure, to provide a film bulk acoustic wave resonator structure.

From the above disclosure of the general principles of the present invention and the preceding detailed description, those skilled in this art will readily comprehend the various modifications, re-arrangements and substitutions to which the present invention is susceptible, as well as the various advantages and benefits the present invention may provide. Therefore, the scope of the invention should be limited only by the following claims and equivalents thereof. In addition, it is understood to be within the scope of the present invention that the disclosed and claimed articles and methods may be useful in applications other than surgical procedures. Therefore, the scope of the invention may be broadened to include the use of the claimed and disclosed methods for such other applications.

EXAMPLES

Example 1

BAW wafers (samples) and a blanket film were prepared according to methods of the present disclosure and compared to a baseline BAW wafer (comparative sample) and blanket film prepared according to prior art methods.

All samples, including the comparative sample, were prepared using a deposition system as described in U.S. patent application Ser. No. 15/293,063 entitled "Deposition System for Growth of Inclined C-Axis Piezoelectric Material Structures."

Three sample wafers (150 mm diameter) and a blanket film were prepared by depositing an AlN crystalline bulk layer in two steps directly onto a substrate. The sample wafers were prepared by depositing a first portion of the AlN crystalline bulk layer in a first step at a deposition angle of 43 degrees and a second portion in a second step at a deposition angle of 0 degrees (normal incidence).

During the first step (at 43 degrees), the deposition pressure was selected at 2.5 mTorr with an argon-to-nitrogen ratio of 6:15. The power was 3 kW, DC current was pulsed at 250 kHz, and the target voltage was 250 V and target current 12 A. The distance from the target to the substrate was 100 mm. The deposition rate was 40 Å/min. The space was not heated but due to the use of plasma, the temperature was estimated to be about 100° C.

During the second step (at normal incidence), the wafer substrate was placed on a stationary pedestal. The deposition pressure was selected at 3.0 mTorr with an argon-to-nitrogen ratio of 1:5. The power was 6 kW, DC current was pulsed at 100 kHz, and the target voltage was 250 V and target current 12 A. The space was heated to 300° C. A 100 W bias was applied to the pedestal. No collimator was used. The distance from the target to the substrate was 50 mm. The deposition rate was 900 Å/min.

A comparative (baseline) sample (150 mm diameter) was prepared by depositing an AlN layer in one step. The AlN layer was deposited at a deposition angle of 43 degrees. The deposition pressure was selected at 2.5 mTorr with an argon-to-nitrogen ratio of 6:15. The power was 3 kW, DC current was pulsed at 250 kHz, and the target voltage was 250 V and target current 12 A. The deposition rate was 40 Å/min. The space was not heated but due to the use of plasma, the temperature was estimated to be about 100° C.

The blanket films were prepared to enable X-ray diffraction measurement of the c-axis angle of the AlN bulk-layer crystals. The AlN bulk-layer crystals deposited on the blanket films correspond to the AlN bulk-layer crystals deposited on the wafers under the same conditions.

The c-axis angle of the AlN bulk-layer crystals on the sample blanket film and the comparative blanket film was measured by a standard X-Ray diffractometer equipped with a goniometer for pole figure measurements. It should be noted that the deposition angles given in this example are nominal settings of the deposition system and some variation may be experienced in the actual the range of angles at which the deposition flux contacts the substrate. However, the relative magnitude of the angles can still be compared.

Figure 8A:
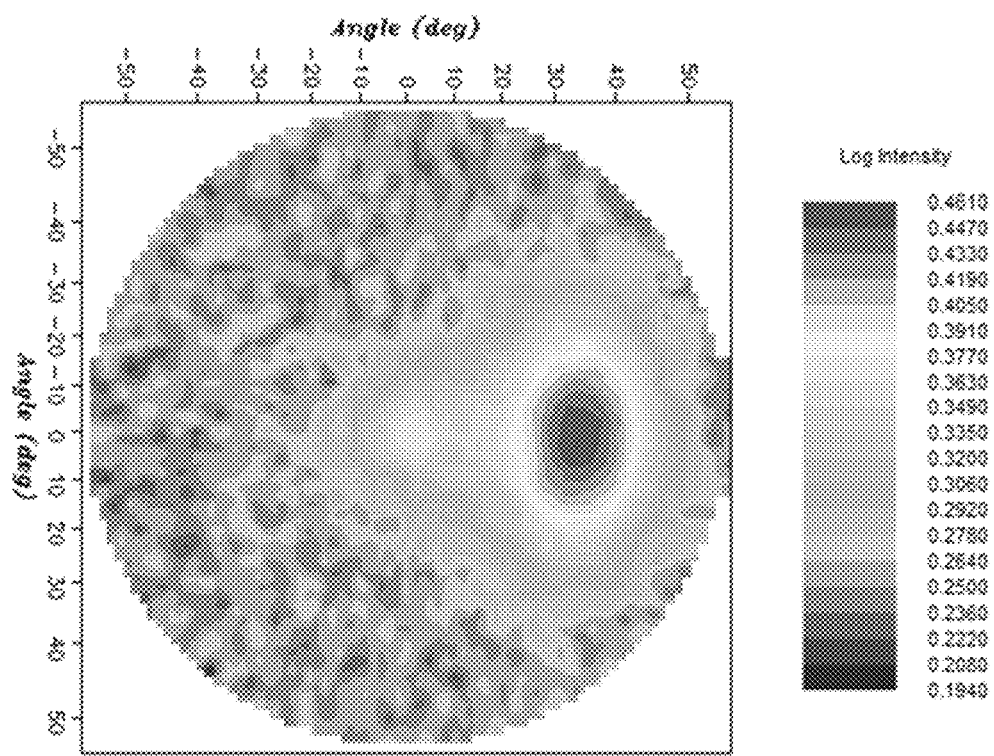
FIGS. 8A and 8B are graphical representations of the c-axis angle of samples from an Example.
Figure 8B:
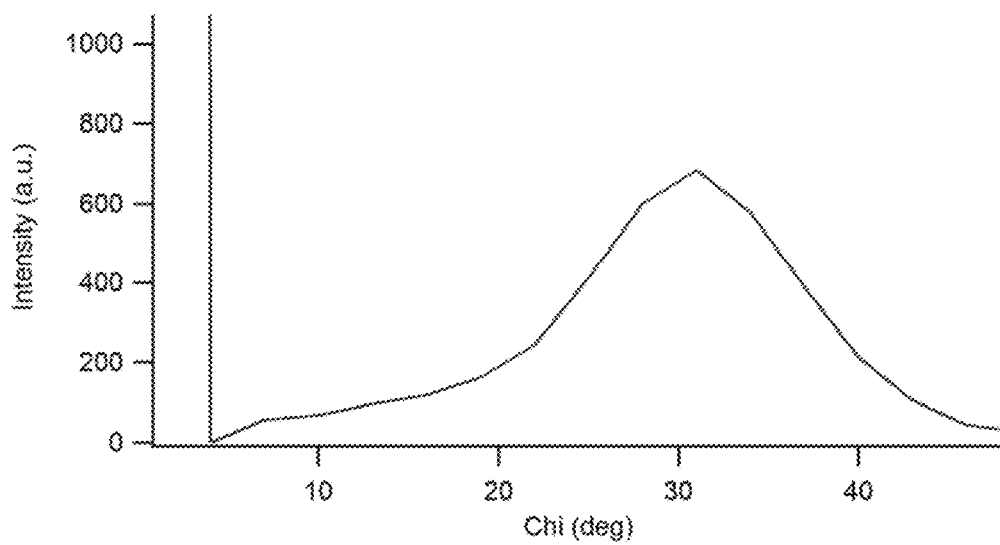
Figure 9A:
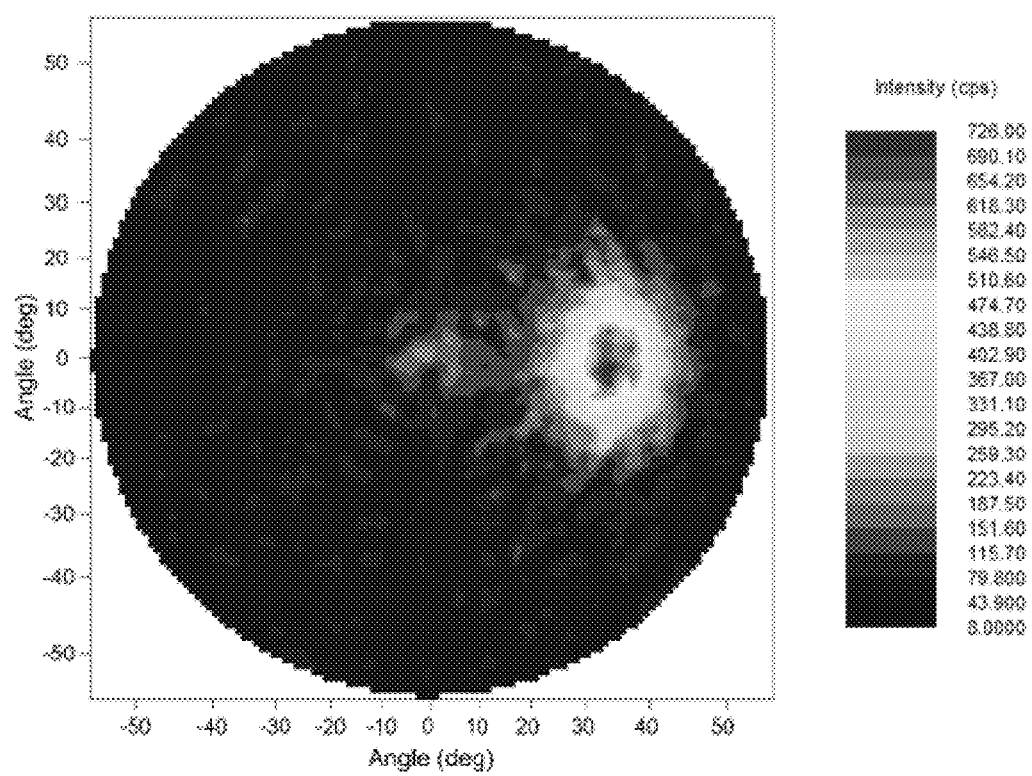
FIGS. 9A and 9B are graphical representations of the c-axis angle of a comparative sample from the Example.
Figure 9B:
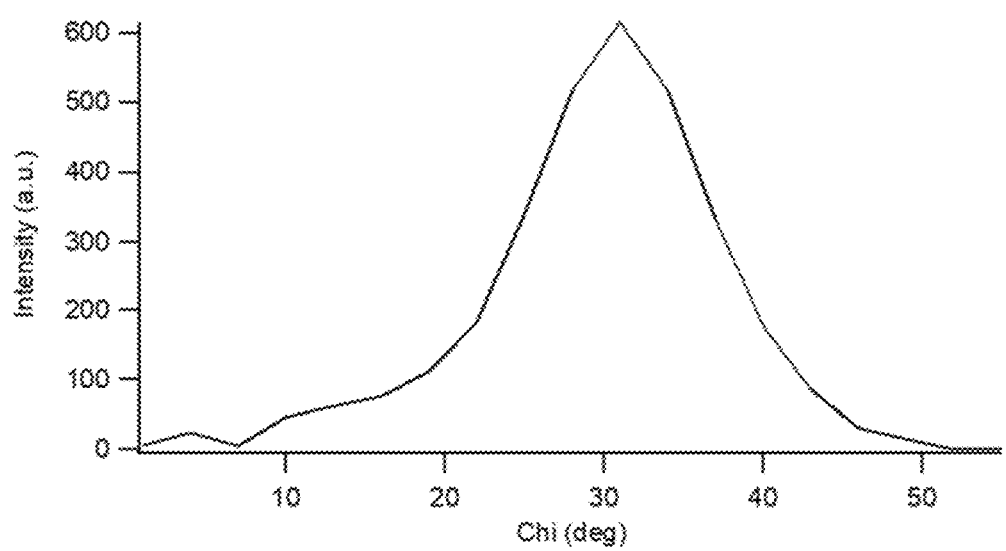

The results are graphically shown in FIGS. 8A and 8B for the sample blanket film, and in FIGS. 9A and 9B for the comparative (baseline) blanket film.

It was observed that by applying a major portion of the bulk layer at normal incidence, a much higher than usual throughput could be achieved. The normal incidence deposition could be done without a collimator at 900 Å/min. This deposition rate results in significant increases in throughput and efficiency.

The samples prepared by the two-step method with the second step at normal incidence had a c-axis tilt angle of approximately 35 degrees, similar to the comparative sample, as seen in the pole FIGS. 8A and 9A, respectively. It was observed that the bulk layer crystallites deposited at normal incidence aligned with the crystallites applied in the first step. It was hypothesized that the crystallites of the first step act as a template for the subsequent bulk layer.

The effective electromechanical coupling coefficient and mechanical quality factor of each wafer were evaluated by investigating the scattering (S-) parameter matrices of the samples using a vector network analyzer to extract resonator performance characteristics. Electrical probing was performed across 100 locations on each wafer, and the results were calculated as normalized averages.

Methods for computing quality factor (Q) and effective coupling coefficient ($k^2_{eff}$) were based on work published by K. M. Lakin, "Modeling of Thin Film Resonators and Filters" IEEE MTT-S Microwave Symposium Digest, 1992 pp. 149-152. Quality factor is determined utilizing the following expression:

$$Q = \frac{1}{2} \times \text{frequency} \times \frac{dZphase}{dfrequency}$$

Effective coupling coefficient is determined by measuring series ($f_s$) and parallel ($f_p$) resonant frequencies and utilizing the following formula:

$$k^2_{eff} = \frac{\varphi s}{\tan \varphi s} \text{ where } \varphi s = \frac{\pi}{2}\left(\frac{fs}{fp}\right)$$

Figure 10:
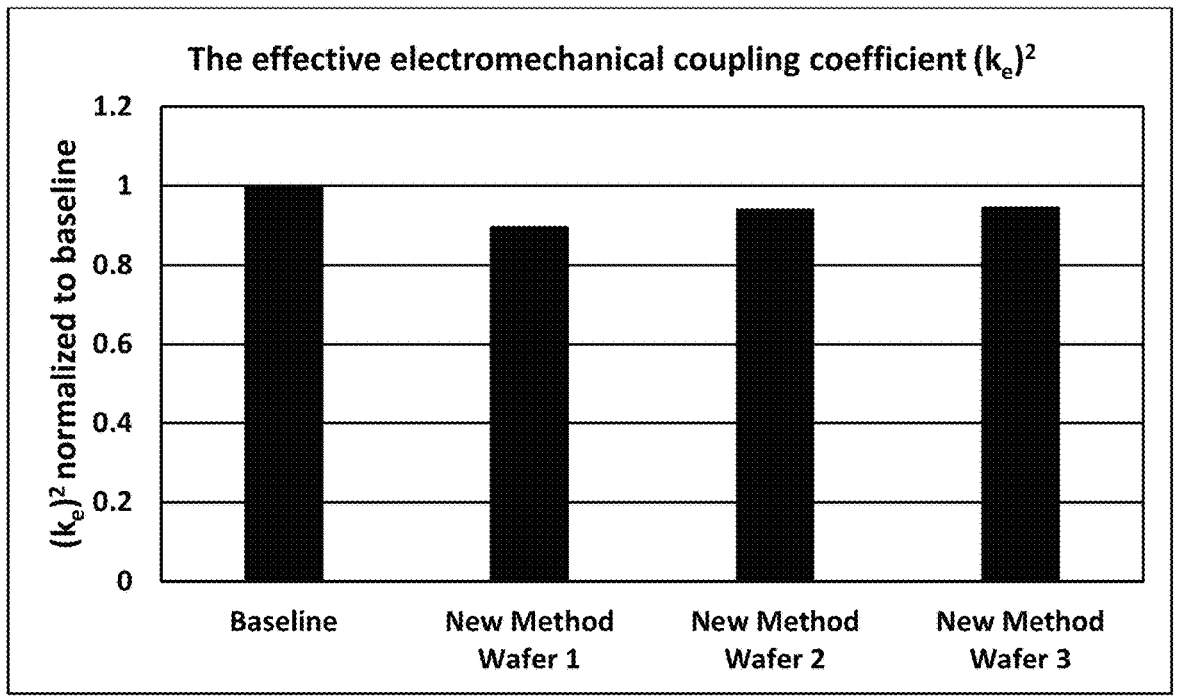
FIG. 10 is a graphical representation of electromechanical coupling of samples and the comparative sample of the Example.
Figure 11:
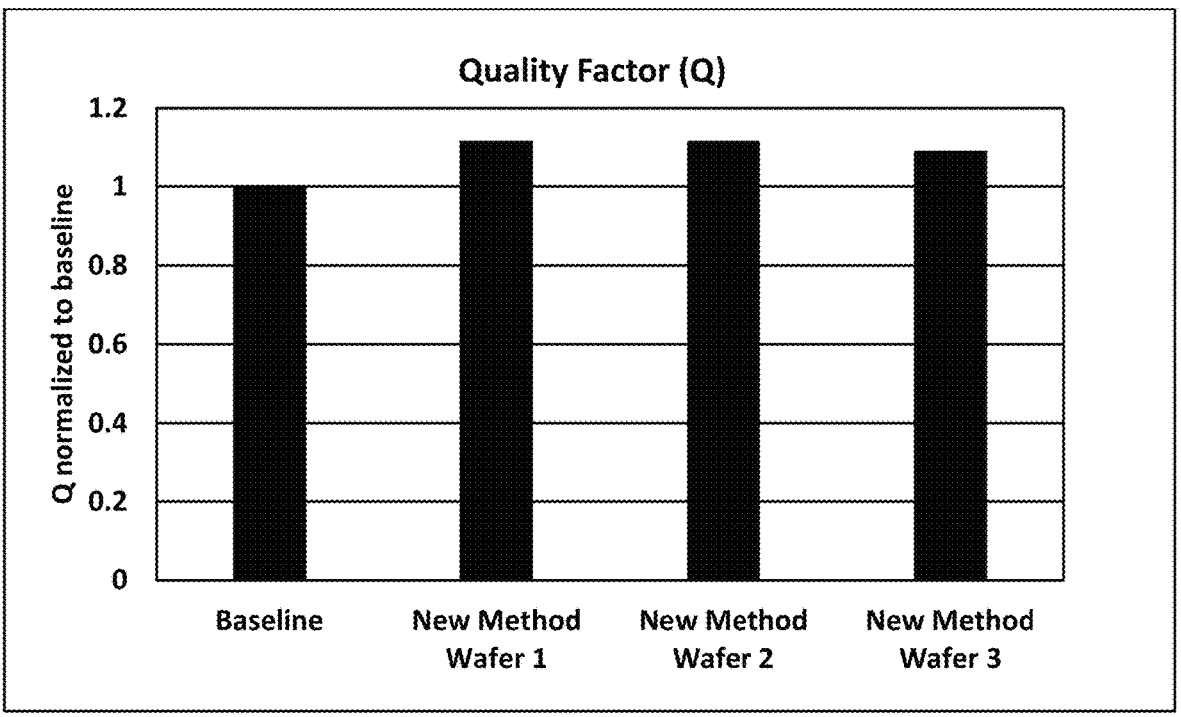
FIG. 11 is a graphical representation of wafer quality of samples and the comparative sample of Example 1.

The results are graphically shown in FIG. 10 showing electromechanical coupling coefficient $(k_e)^2$ and in FIG. 11 showing mechanical quality factor (Q) normalized to the comparative (baseline) sample.

It was observed that the electrical performances of sample films grown under deposition conditions according to the present disclosure were comparable to the comparative (baseline) sample. The mechanical quality factor (Q) measured on the sample wafers was comparable or slightly higher (approximately 1.1 times) than the comparative (baseline) sample.

Example 2

Sample films and comparative films were prepared as in Example 1. Surface roughness of the films was tested using atomic force microscopy (AFM) using Dimension 5000 instrument from Bruker Corp. in Billerica, Mass. (formerly available from Digital Instruments).

Figure 12:
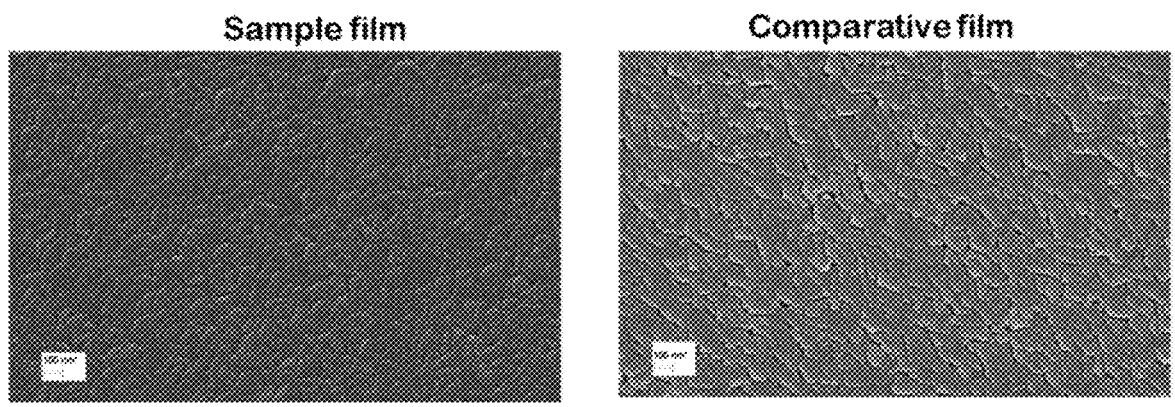
FIG. 12 shows SEM images of samples and the comparative sample of Example 2.
Figure 13:
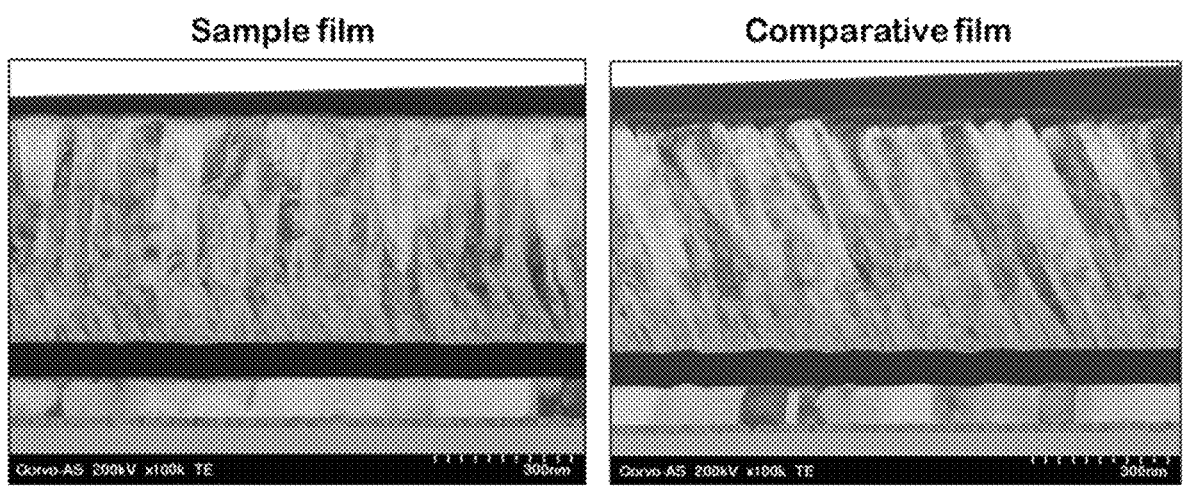
FIG. 13 shows STEM images of samples and the comparative sample of Example 2.
Figure 14:
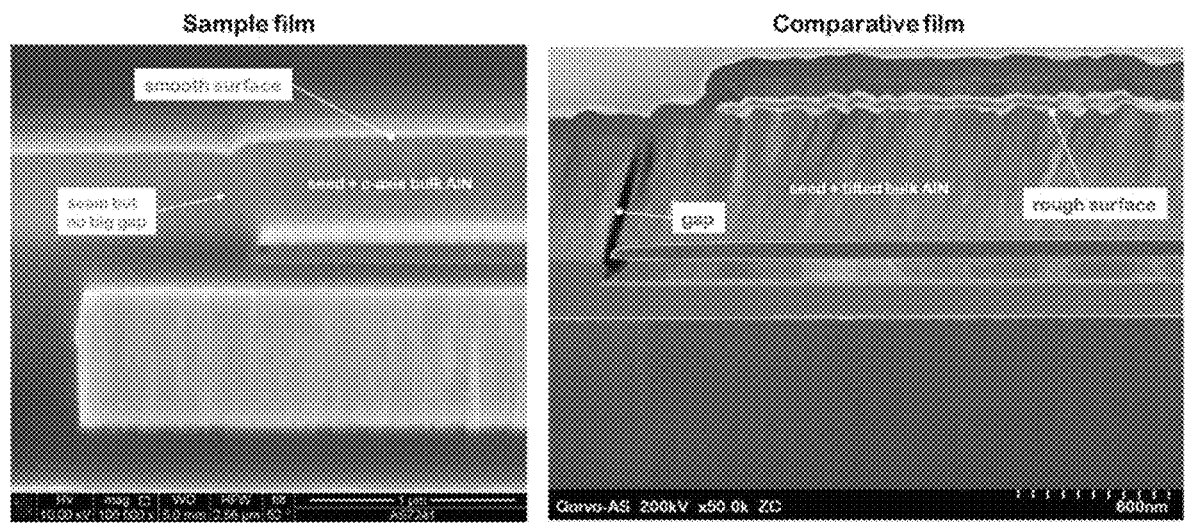
FIG. 14 shows STEM images of samples and the comparative sample of Example 2.

The films were cut using focused ion beam (FIB) for taking microscopic images of the cross section. A FEI Nova Nanolab 6001 SEM (scanning electron microscope) equipped with FIB was used for cutting and for SEM images. High resolution scanning tunneling electron microscopic (STEM) images were obtained using Hitachi 2300A STEM. SEM images of the surface of the sample film and comparative film are shown in FIG. 12 (100,000× magnification). STEM images of the cross section are shown in FIG. 13 (100,000× magnification). It should be noted that the main grain structure seen in the images is the bulk grain structure, as opposed to the c-axis tilt. STEM images of the cross section that demonstrate a seam (sample film) or gap (comparative film) in the deposited layer are shown in FIG. 14. The results are shown in TABLE 1 below.

TABLE 1

| Surface roughness results. | | | |
| --- | --- | --- | --- |
|  | Roughness Rq | Roughness Ra | Roughness Rmax |
| Sample film, center | 5.4 nm | 4.40 nm | 49.1 nm |
| Sample film, edge | 4.01 nm | 3.18 nm | 30.3 nm |
| Comparative film, center | 6.37 nm | 5.10 nm | 48.6 nm |
| Comparative film, edge | 6.55 nm | 5.22 nm | 62.0 nm |

It was observed that the samples films had lower surface roughness than the comparative films. It was further observed that the sample films had a more even film thickness than the comparative films, having variations in film thickness of less than 2%, as opposed to greater than 2% for the comparative films.

It is hypothesized that prior art methods cause a gap to form at the edges of the bulk film due to shadowing effects during deposition. It was observed that the sample film did not exhibit a gap, and only a seam is visible where the comparative film exhibits a gap.

Example 3

Figure 15:
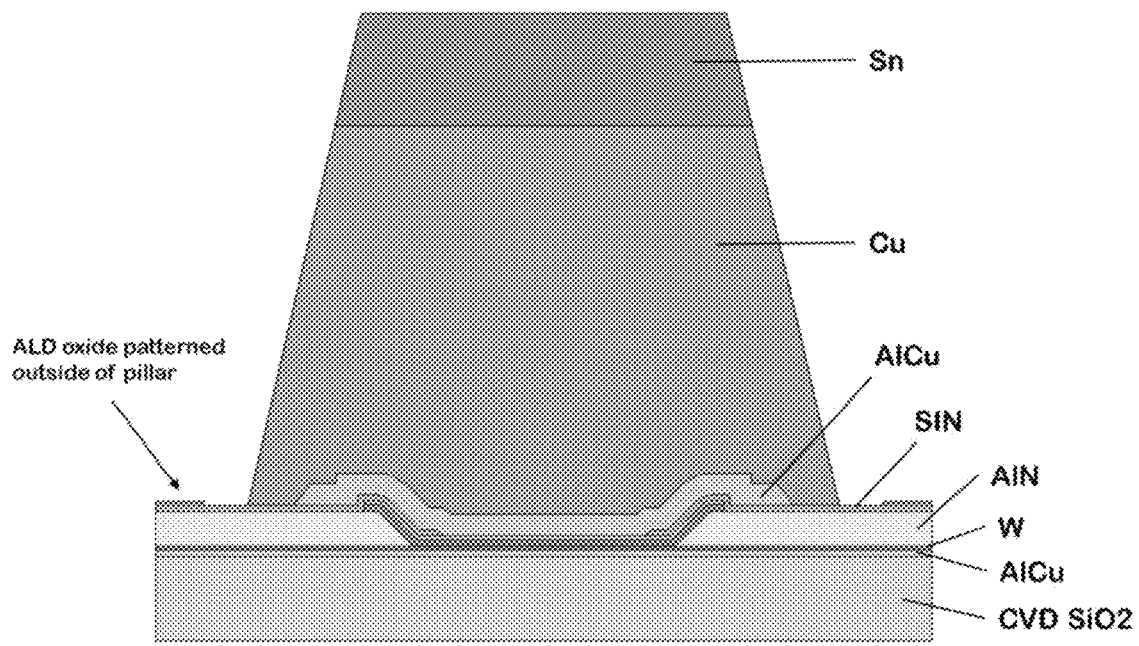
FIG. 15 shows a schematic drawing of a bump prepared in Example 3.

To test the shear strength of biosensor bumps made using the blanket films, bump samples were prepared according to the schematic in FIG. 15. The bump samples were made on sample films and comparative films prepared according to Example 1.

Figure 16:
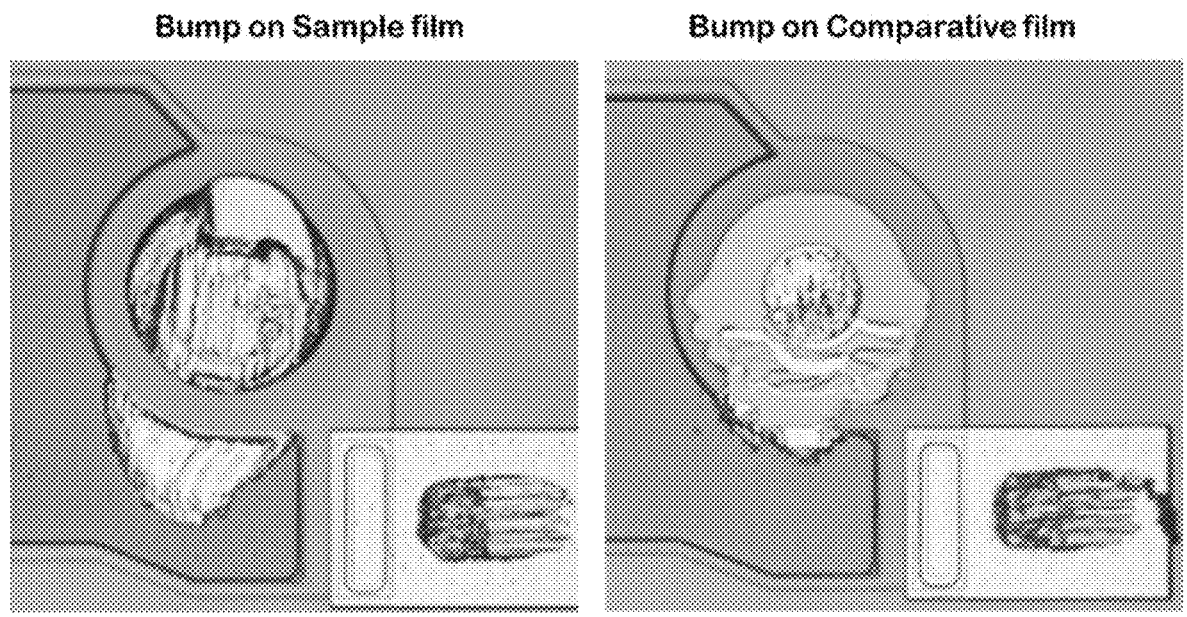
FIG. 16 shows images of shear failure testing of the bumps of FIG. 15.
Figure 17:
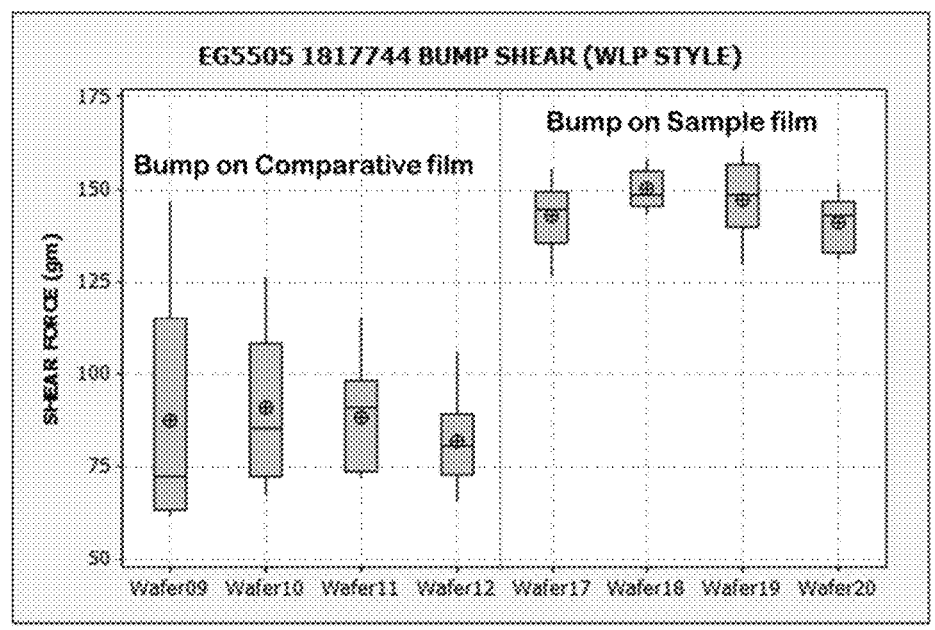
FIG. 17 is a graphical representation of the results of Example 3.

The bump samples were exposed to a shear test using a bond shear measurement tool that may be used during manufacturing to test products for their tolerance of shear forces. The shear testing was run at wafer level, taking 20 measurements of one wafer. The comparative film bumps exhibited some reliability issues due to tear outs and cracks into the substrate. The typical failure modes of the bump on the sample film and the bump on the comparative film can be seen in the images in FIG. 16. The comparative film bump has failed with a tear out into the substrate, unlike the sample film bump. It can also be seen that the bump on the sample film still has some copper remaining after failure, while the comparative film does not. The sample films also produced bumps with a higher tolerance for shear stress, as seen in the graphical representation in FIG. 17. The sample film bumps failed when exposed to shear forces ranging from 125 g to 160 g. The comparative film bumps failed when exposed to shear forces ranging from 50 g to 150 g. It was also observed that the comparative film bumps exhibited greater variability in shear strength.

It was further observed that resonators prepared using the sample films had a lower variance in $f_s$ (series resonance frequency) and dry gain than resonators prepared from the comparative films. The electrical performance of the resonators was measured by making electrical contacts to the films. The fs variance of resonators prepared from the sample films was below +/−100 MHz, whereas the fs variance of resonators prepared from the comparative films was above +/−100 MHz. The variance in dry gain of resonators prepared from the sample films was less than 2%, whereas the variance in dry gain of resonators prepared from the comparative films was above 2%.

The results of Examples 1-3 demonstrate that a bulk layer can be deposited in two steps using the methods of the present disclosure, where in the second step the deposition is done at a normal incidence angle, resulting in a bulk layer that is at least comparable or better than a bulk layer deposited using prior art methods. The bulk layer exhibits lower surface roughness and greater thickness uniformity. The structures manufactured using the bulk layer exhibit greater shear strength. The improved qualities of the bulk layer result in process improvements, such as greater process throughput and lower process cost.

The invention claimed is:
1. A structure comprising:
   a substrate comprising a wafer or a portion thereof;
   a piezoelectric bulk material layer comprising a first portion deposited onto the substrate and a second portion deposited onto the first portion, the second portion comprising an outer surface having a surface roughness (Ra) of 4.5 nm or less; and a bump disposed at least partially on the piezoelectric bulk material layer, the bump being able to withstand shear forces of 120 g or greater.

2. The structure of claim 1, wherein the outer surface has a surface roughness (Ra) of 4 nm or less.

3. The structure of claim 1, wherein the bump is able to withstand shear forces of 125 g or greater.

4. The structure of claim 1, wherein the first portion has a first c-axis tilt and the second portion has a second c-axis tilt that substantially aligns with the first c-axis tilt.

5. The structure of claim 4, wherein the first c-axis tilt is about 35 degrees to about 52 degrees.

6. The structure of claim 1, wherein the first portion has a first bulk grain orientation and the second portion has a second bulk grain orientation, and wherein the second bulk grain orientation is different from the first portion.

7. The structure of claim 6, wherein the second bulk grain orientation is substantially vertical.

8. The structure of claim 1, wherein the piezoelectric bulk material layer comprises AlN.

9. The structure of claim 1, wherein the piezoelectric bulk material layer exhibits a ratio of shear coupling to longitudinal coupling of 1.25 or greater during excitation.

10. The structure of claim 1, wherein the piezoelectric bulk material layer has a thickness of about 1,000 Angstroms to about 30,000 Angstroms and wherein the thickness varies by less than 2% over an area of the piezoelectric bulk material layer.

11. The structure of claim 1, wherein the structure is prepared by:

depositing a first portion of a bulk material layer onto a substrate at a first incidence angle, the first portion having a first c-axis tilt; and depositing a second portion of the bulk material layer onto the first portion at a second incidence angle that is smaller than the first incidence angle, the second portion having a second c-axis tilt that substantially aligns with the first c-axis tilt.

12. The structure of claim 11, wherein the first portion, the second portion, or both are deposited under deposition conditions comprising a pressure of less than 5 mTorr.

13. The structure of claim 12, wherein the pressure is from about 1 mTorr to about 4 mTorr.

14. A bulk acoustic wave resonator comprising the structure of claim 1, and further comprising a first electrode and a second electrode, wherein at least a portion of piezoelectric bulk material layer is between the first electrode and the second electrode.

* * * * *